US010846447B2

(12) United States Patent
Myers et al.

(10) Patent No.: US 10,846,447 B2
(45) Date of Patent: Nov. 24, 2020

(54) METHOD AND SYSTEM FOR STACKING FRACTURE PREDICTION

(71) Applicants: Rodrick Myers, Houston, TX (US); Leonel A. Gomez Torres, Houston, TX (US); Hao Huang, The Woodlands, TX (US); Gauthier D. Becker, The Woodlands, TX (US)

(72) Inventors: Rodrick Myers, Houston, TX (US); Leonel A. Gomez Torres, Houston, TX (US); Hao Huang, The Woodlands, TX (US); Gauthier D. Becker, The Woodlands, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 618 days.

(21) Appl. No.: 15/496,859

(22) Filed: Apr. 25, 2017

(65) Prior Publication Data
US 2017/0315249 A1  Nov. 2, 2017

Related U.S. Application Data

(63) Continuation-in-part of application No. 15/496,249, filed on Apr. 25, 2017, now Pat. No. 10,572,611.

(60) Provisional application No. 62/446,702, filed on Jan. 16, 2017, provisional application No. 62/446,711, filed on Jan. 16, 2017, provisional application No. (Continued)

(51) Int. Cl.
*G01V 99/00* (2009.01)
*G06F 30/23* (2020.01)
*G06G 7/48* (2006.01)

(52) U.S. Cl.
CPC .............. *G06F 30/23* (2020.01); *G01V 99/005* (2013.01); *G06G 7/48* (2013.01); *G01V 2210/646* (2013.01)

(58) Field of Classification Search
CPC ... G06F 17/5018; G06F 30/23; G01V 99/005; G01V 2210/646; G06G 7/48
USPC ........................................................ 703/10, 2
See application file for complete search history.

(56) References Cited

U.S. PATENT DOCUMENTS

| 6,810,332 B2 | 10/2004 | Harrison |
| 6,826,483 B1 | 11/2004 | Anderson et al. |
| 6,985,841 B2 | 1/2006 | Barroux |

(Continued)

OTHER PUBLICATIONS

Hughes, T.J.R. (1987) "The Finite Element Method-Linear Static and Dynamic Finite Element Analysis", Front-2 pages and Table of Contents, pp. iii to x; ISBN-13: 978-0486411811.

(Continued)

*Primary Examiner* — Juan C Ochoa
(74) *Attorney, Agent, or Firm* — ExxonMobil Upstream Research Company—Law Department

(57) ABSTRACT

Methods and systems for modeling and predicting fractures within the subsurface region are provided. The methods and systems use multi-layer models to represent stacks of layered rocks, which are used to evaluate shear tractions caused by the relatively higher lateral strains in a more compliant overlying or underlying adjacent layers. As the lateral strains can induce tensional stresses in the brittle layers that can exceed the rocks tensile strength and fail, the formation of natural fractures may be modeled. Accordingly, the method and system model fractures due to stacking using mechanical rock property information from well logs and simulating the farfield loading conditions using basin history.

19 Claims, 9 Drawing Sheets

Related U.S. Application Data

62/446,706, filed on Jan. 16, 2017, provisional application No. 62/329,681, filed on Apr. 29, 2016.

(56) References Cited

U.S. PATENT DOCUMENTS

| | | | |
|---|---|---|---|
| 7,043,410 B2 * | 5/2006 | Malthe-Sorenssen | G01V 1/282 703/2 |
| 7,526,418 B2 | 4/2009 | Pita et al. | |
| 7,542,850 B2 | 6/2009 | Humphrey et al. | |
| 7,596,480 B2 | 9/2009 | Fung et al. | |
| 7,617,082 B2 | 11/2009 | Childs et al. | |
| 7,676,326 B2 | 3/2010 | Podladchikov et al. | |
| 7,809,538 B2 | 10/2010 | Thomas | |
| 8,190,414 B2 | 5/2012 | Huang et al. | |
| 8,219,320 B2 | 7/2012 | Saenger | |
| 8,494,827 B2 | 7/2013 | Mutlu et al. | |
| 8,577,613 B2 | 11/2013 | Bryant et al. | |
| 8,793,110 B2 | 7/2014 | Myers et al. | |
| 9,085,957 B2 | 7/2015 | Wallace et al. | |
| 9,152,745 B2 * | 10/2015 | Glinsky | G06F 17/5009 |
| 9,377,547 B2 * | 6/2016 | Williams | G01V 1/288 |
| 2011/0011595 A1 * | 1/2011 | Huang | E21B 43/00 166/369 |
| 2011/0077918 A1 | 3/2011 | Mutlu et al. | |
| 2011/0272152 A1 | 11/2011 | Kaminsky et al. | |
| 2012/0271609 A1 * | 10/2012 | Laake | G01V 1/003 703/10 |
| 2013/0311158 A1 | 11/2013 | Dasari | |
| 2015/0355158 A1 * | 12/2015 | Lander | G01N 33/383 702/2 |
| 2016/0124117 A1 | 5/2016 | Huang et al. | |

OTHER PUBLICATIONS

Hughes, T.J.R. (1987) "The Finite Element Method-Linear Static and Dynamic Finite Element Analysis", Chapter 1 Fundamental Concepts; a Simple One-Dimensional Boundary-Value Problem; pp. 1 to 56.

Hughes, T.J.R. (1987) "The Finite Element Method-Linear Static and Dynamic Finite Element Analysis", Chapter 2 Formulation of Two- and Three-dimensional Boundary-value Problems; pp. 7 to 108.

Hughes, T.J.R. (1987) "The Finite Element Method-Linear Static and Dynamic Finite Element Analysis", Chapter 3 Isoparametric Elements and Elementary Programming Concepts; pp. 109 to 184.

Belytschko, T. et al. (1999) "Elastic crack growth in finite elements with minimal remeshing," *International Journal for Numerical Methods in Engineering*, 45 (5): pp. 601 to 620.

Bourdin, B. et al. (2008) "The Variational Approach to Fracture" *Journal of Elasticity*, 91:pp. 5-148.

Bourne, S. J., (2003) "Contrast of elastic properties between rock layers as a mechanism for the initiation and orientation of tensile failure under uniform remote compression", Journal of Geophysical Research, vol. 108, No. B8, 2395, pp. 14-1 to 14-12.

Goktan et al., (2005) "A new methodology for analysis of relationships between brittleness index and drag pick cutting efficiency", *J. S. Afr. Inst. Min. Metall.*, 105, pp. 727-733.

Jager, P., et al. (2008), "Modeling three-dimensional crack propagation—A comparison of crack path tracking strategies", *Int. J. Numer. Methods Eng.* 76, pp. 1328-1352.

Keating, D. P., et al. (2008), "An experimental evaluation of the curvature-strain relation in fault-related folds", *AAPG Bulletin* v. 92, No. (7), 20, pp. 869-884.

Klerck et al. (2004), "Discrete fracture in quasi-brittle materials under compressive and tensile stress states", *Methods in Applied Mechanics and Engineering*, vol. 193, pp. 3035-3056.

Mullen et al., (2012) "Fracability Index—More Than Just Calculating Rock Properties", *SPE Annual Technical Conference and Exhibition*, San Antonio, TX, Oct. 8-10, 2012, SPE 159755, pp. 1-10.

Renshaw, C.E., et al., (2003) "Role of heterogeneity in elastic properties and layer thickness in the jointing of layered sedimentary rocks", *Geophysical Research Letters*, vol. 30, No. 24, 2295, pp. 13-1 to 13-4.

Rickmann, R. et al., (2008) "A practical use of shale petrophysics for stimulation design optimization: all shale plays are not clones of the Barnett Shale", *2008 Annual Technical Conference and Exhibition*, SPE 115258, pp. 1-11.

Thomas A. L. et al. (1993) "The geometry of echelon fractures in rock: implications from laboratory and numerical experiments", *Journal of Structural Geology*, vol. 15, Nos. 3-5, pp. 323-334.

Yagiz, S., (2009) "Assessment of brittleness using rock strength and density with punch penetration test", *Tunneling and Underground Space Technology*, 24, pp. 66-74.

Enderlin et al. (2011) "Predicting Fracability in Shale Reservoirs", Search and Discovery Article #40783, 2 pgs.

* cited by examiner

METHOD AND SYSTEM FOR STACKING FRACTURE PREDICTION

CROSS-REFERENCE TO RELATED APPLICATIONS

This application claims the benefit of (i) U.S. Provisional Patent Application No. 62/329,681 entitled "Method and System for Stacking Fracture Prediction" filed on Apr. 29, 2016, (ii) U.S. Provisional Patent Application No. 62/446,702 entitled "Method and System for Stacking Fracture Prediction" filed on Jan. 16, 2017, (iii) U.S. Provisional Patent Application No. 62/446,706 entitled "Method and System for Forming and Using a Subsurface Model in Hydrocarbon Operations" filed on Jan. 16, 2017, and (iv) U.S. Provisional Patent Application No. 62/446,711 entitled "Method and System for Generating and Using a Subsurface Model in Hydrocarbon Operations" filed on Jan. 16, 2017; and this application is a continuation-in-part of U.S. patent application Ser. No. 15/496,249 entitled "Method and System for Characterizing Fractures in a Subsurface Region" filed on Apr. 25, 2017 which claims the benefit of the provisional patent applications listed in (i)-(iv) above; the disclosures of which are incorporated herein by reference.

FIELD OF THE INVENTION

This disclosure relates generally to the field of hydrocarbon exploration, hydrocarbon development, and hydrocarbon production, and more particularly, to subsurface models used therein. Specifically, this disclosure relates to systems and methods for predicting fractures in subsurface regions and modeling the fractures in subsurface regions. In particular, the methods and systems may be associated with fracture stacking prediction for natural fractures and methods and systems for predicting and modeling natural fractures and damage localization in rock and at different scales.

BACKGROUND

This section is intended to introduce various aspects of the art, which may be associated with exemplary embodiments of the present techniques. This description is believed to assist in providing a framework to facilitate a better understanding of particular aspects of the present techniques. Accordingly, it should be understood that this section should be read in this light, and not necessarily as admissions of prior art.

The exploration, development, and production of hydrocarbons from a reservoir often involves modeling the subsurface region to determine the location, quantity, and flow of hydrocarbons. The modeling may include modeling the geology with geologic models to understand the physical structure and configuration of the subsurface structures, while other modeling may include estimating the fluid flow with reservoir models. Each of these different models may be utilized to provide different understandings or insights to the subsurface region that are utilized for the production of hydrocarbons.

Fractures may complicate the recovery of hydrocarbons from the subsurface. Fractures may be produced by gravity and mild tectonic loading of otherwise underformed strata in the subsurface. Within a stack of layered rocks, the layers with a relatively higher degree of brittleness may fracture due to lateral strains imposed on that layer by lateral deformation of more compliant overlying or underlying adjacent layers. Fractures produced by this process have been predicted using mechanical rock property information from well logs and simulating the farfield loading conditions using basin history.

As an example, extensional strain in the subsurface layers is usually accommodated by opening mode natural fractures, known as joints that grow perpendicular to the primary tensile principal stress. Joints may form under a combination of macromechanically driven loading conditions, such as elevated pore pressures, folding of geological strata, vertical loading of heterogeneous stacked layers, slip along preexisting faults, and others. Although the existence of microflaws may play a role in fracture initiation and propagation, mechanically driven factors dominate the resulting natural fracture patterns. Natural fractures may occur in varying orientations, occur in clusters, have different propagating lengths and have various apertures. Accordingly, fracture prediction has to characterize such properties.

Because joints may affect the movement, storage, and recovery of hydrocarbons, a substantial effort has been focused on predicting the characteristics of subsurface systems. The most commonly sought characteristics include the intensity, aperture, and orientation of the dominant set of joints. In data rich fields, fracture characterization efforts include analyzing the image logs and core data, and sometimes investigating seismic attributes such as the azimuthal variation of P-wave velocities or amplitude vs. offset. However, in fields where subsurface data are limited, or in early stages of exploration, fracture characteristics have been predicted from 2D or 3D restoration or curvature analyses which can have limited power for fracture prediction. See, e.g., Keating D. P., and Fischer, M. P., 2008, *An experimental evaluation of the curvature-strain relation in fault-related folds*, AAPG Bulletin v. 92, no. (7), 20 p. 869-884.

To predict hydraulic fractures, various brittleness prediction methods have been implemented. For example, Bourne describes a method that uses a stress algorithm to calculate stress heterogeneity in a heterolithic stack. See, Bourne, Stephen J., *Contrast of elastic properties between rock layers as a mechanism for the initiation and orientation of tensile failure under uniform remote compression*, Journal of Geophysical Research, Vol. 108, No. B8, 2395, p. 14-1 to 14-12 (2003). While Bourne describes an analytical solution for a fully elastic system in relation to joint formation of hydraulic fractures, Bourne does not provide numerical and analytical results relating to the formation of natural fractures or metrics to predict the characteristics of natural fractures.

As another example, Renshaw describes an experimental study that provides that tension develops in stiff layers in a composite material (e.g., rubber and brick). See, Renshaw, et al., Role of heterogeneity in elastic properties and layer thickness in the jointing of layered sedimentary rocks, Geophysical Research Letters, Vol. 30, No. 24, 2295, p. 13-1 to 13-4 (2003). Renshaw describes how overburden weight acts in conjunction with heterogeneity in elastic properties to induce tensile stress for regional jointing and that there is a need for a change in stress to create fractures. However, Renshaw does not provide numerical and analytical results relating to the formation of natural fractures or metrics to predict the characteristics of natural fractures.

As yet another example, certain brittleness prediction methods have used equations that are based on empirical assumptions, not physics. For example, Yagiz and Goktan et al. describe calculating a brittleness index (BI). See Yagiz, S., *Assessment of brittleness using rock strength and density with punch penetration test*, Tunneling and Underground Space Technology, 24, p. 66-74 (2009) and Goktan et al., *A* new methodology for analysis of relationships between brittleness index and drag pick cutting efficiency, J. S. Afr. Inst. Min. Metall., 105, p. 727-733 (2005). The brittleness index may be based on a punch penetration test and rock cutting. However, these references do not provide numerical and analytical results relating to the formation of natural fractures or metrics to predict the characteristics of natural fractures.

Another brittleness prediction method may include calculating the fracability. The fracability is the ease with which a rock can be forced into supporting a complex fracture network proximal to a well bore. By way of example, Enderlin et al., describes calculating the Brittleness Index (BI), with the following equation:

$$BI = \frac{\left(\frac{E-1}{7}\right)+\left(\frac{v-0.4}{-0.25}\right)}{2}$$

where E is the Static Young's modulus (calibrated), and v is Poisson's ratio. See Enderlin et al., Predicting Fracability in Shale Reservoirs, Search and Discovery Article No. 40782, p. 2 (2011). However, Enderlin does not provide numerical and analytical results relating to the formation of natural fractures or metrics to characteristics the formation of natural fractures.

Further, as another example, the brittleness prediction method may include calculating a complex fracability index (CFI) that combines brittleness index and a semi-quantitative measure of potential contributions from pre-existing fractures. The semi-quantitative measure may be referred to as a stressed fracture index (SFI) for forming a complex fracture network. See Rickmann et al., *A practical use of shale petrophysics for stimulation design optimization: all shale plays are not clones of the Barnett Shale,* 2008 Annual Technical Conference and Exhibition, SPE 115258 (2008) and Mullen et al., *Fracability Index—More than rock properties,* Annual Technical Conference and Exhibition, SPE 159755 (2012). As described by Rickmann and Mullen et al., the complex fracability index may be calculated with the following equation:

CFI=(BI+SFI)/2

Also, another brittleness prediction method may include calculating the Jarvie's Brittleness ($B_J$). As described in Enderlin, the Jarvie's Brittleness may be calculated by solving the following equation:

$B_J=(V_{SiO2})/(V_{clay}+V_{SiO2}\pm V_{CaCO3})$ where $V_{SiO2}$ is volume fraction of siliceous, $V_{clay}$ is volume fraction of clay, and $V_{CaCO3}$ is volume fraction of carbonate.

Despite the foregoing, there remains a need in the industry for methods and systems that provided enhancements to modeling and predicting natural fractures in subsurface regions, and more particularly, to modeling and predicting natural fractures and damage localization in rock and at different scales. The present techniques provide various enhancements by adjusting rock properties and boundary conditions over time and by predicting natural fractures using a mechanism tied to basin history.

SUMMARY

Described herein are methods for predicting natural fractures in a subsurface region. The methods may comprise: creating a multi-layer model of the subsurface region; populating the multi-layer model with mechanical rock properties; applying a plurality of loads to the multi-layer model; determining a stress in each layer of the multi-layer model for each of the plurality of loads; determining a tensile failure at each layer in the multi-layer model for each of the plurality of loads to create one or more natural fractures in the multi-layer model; determining one or more fracture characteristics or metrics associated with natural fractures for each layer in the multi-layer model based on the tensile failures; and performing hydrocarbon management for the subsurface region based on the one or more fracture characteristics or metrics. The one or more fracture characteristics or metrics may comprise one of fracture stacking potential; normalized fracture stacking potential; multi-scale fracture stacking potential; total fracture stacking potential; and any combination thereof.

The methods may also include determining one or more numerical results associated with natural fractures for each layer in the multi-layer model based on the tensile failures. Also, the methods may include creating a representation of the subsurface region with one or more tensile failures, one or more fracture characteristics or metric, numerical results, and any combination thereof and the representation of the subsurface region may be based on the one or more fracture characteristics or metrics and the numerical results.

In one or more embodiments, the method may include calculating the multi-scale fracture potential by solving:

$$MSP = \sum_{n=1}^{\# \text{ of samples}} \frac{\text{Independent Peak Amplitude}}{\left(\text{Reference } FP*\left(\frac{\text{Zone Length}}{2}-1\right)\right)},$$

where n is an integer for the number of samples; Independent Peak Amplitude is the highest value for a continuous non-zero section of the fracture potential response for a zone of interest; Reference FP is highest value for the fracture stacking potential over all of the samples; and Zone Length is length of the zone of interest. Also, the method may include calculating the total fracture stacking potential by solving:

$$TSP = \sum_{n=1}^{\# \text{ Zones}} \left(MSP_n + \frac{FP_n}{C*(L_{zone_n})}\right) * \frac{L_{zone_n}}{L_{interval}},$$

where n is number of zones; MSPn is the multi-scale fracture stacking potential for the nth zone; FPn is the fracture stacking potential for the nth zone; C is a normalization factor; Lzonen is length of the nth zone; and Linterval is total length of the zones in the interval.

BRIEF DESCRIPTION OF THE DRAWINGS

The advantages of the present techniques are better understood by referring to the following detailed description and the attached drawings.

DETAILED DESCRIPTION

Figure 1:
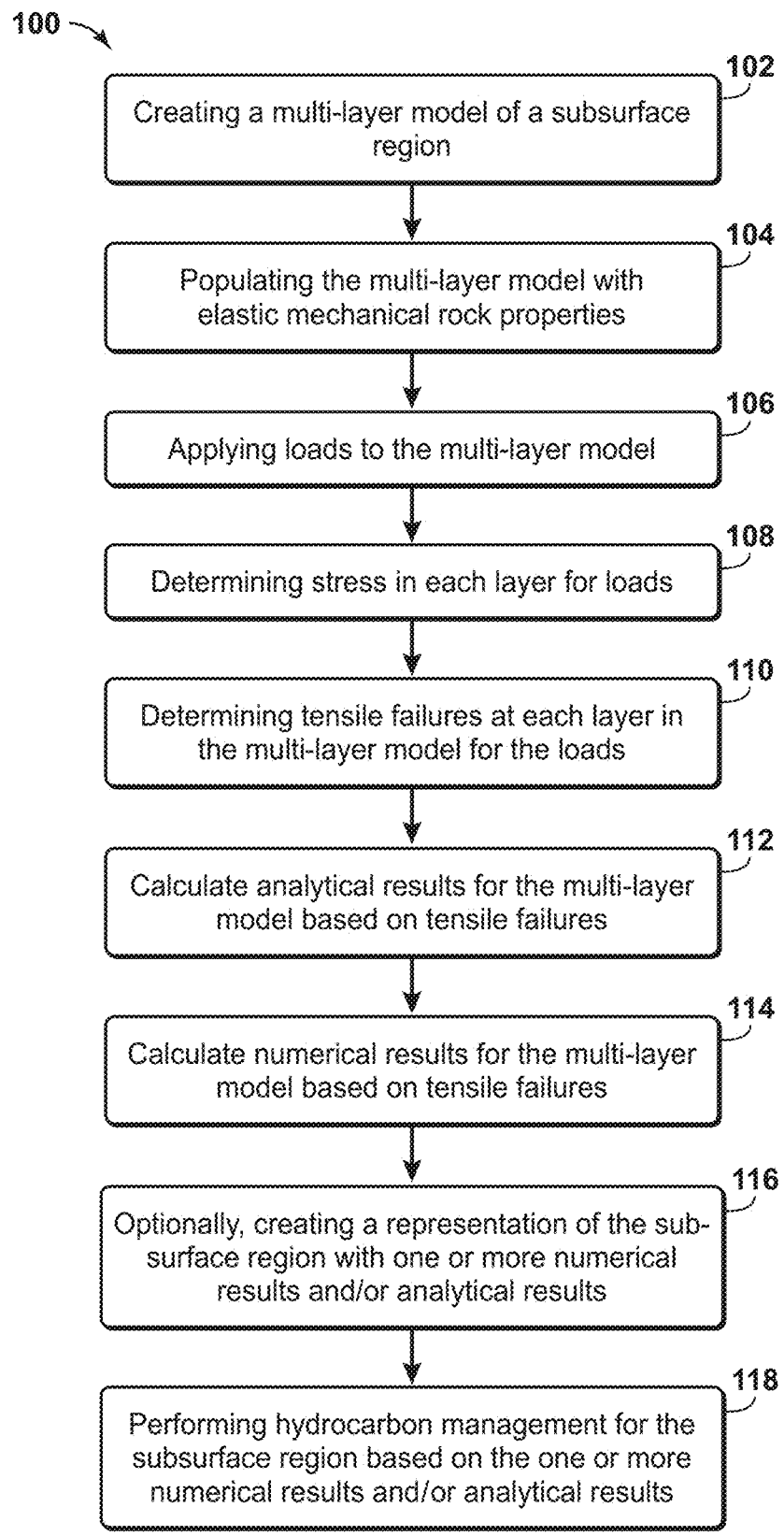
FIG. 1 is a flowchart in accordance with the present techniques.

In the following detailed description section, specific embodiments of the present techniques are described. However, to the extent that the following description is specific to a particular embodiment or a particular use of the present techniques, this is intended to be for exemplary purposes only and simply provides a description of the exemplary embodiments. Accordingly, the techniques are not limited to the specific embodiments described below, but rather, include all alternatives, modifications, and equivalents falling within the true spirit and scope of the appended claims.

At the outset, for ease of reference, certain terms used in this application and their meanings as used in this context are set forth. To the extent a term used herein is not defined below, it should be given the broadest definition persons in the pertinent art have given that term as reflected in at least one printed publication or issued patent. Further, the present techniques are not limited by the usage of the terms shown below, as all equivalents, synonyms, new developments, and terms or techniques that serve the same or a similar purpose are considered to be within the scope of the present claims.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional blocks not shown herein. While the figures illustrate various actions occurring serially, it is to be appreciated that various actions could occur in series, substantially in parallel, and/or at substantially different points in time.

Further, some portions of the detailed description which follows are presented in terms of procedures, steps, logic blocks, processing and other symbolic representations of operations on data bits within a memory in a computing system or a computing device. These descriptions and representations are the means used by those skilled in the data processing arts to most effectively convey the substance of their work to others skilled in the art. In this detailed description, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

Unless specifically stated otherwise as apparent from the following discussions, terms such as "defining", "creating", "including", "representing", "pre-analyzing", "pre-defining", "choosing", "building", "assigning", "creating", "introducing", "eliminating", "remeshing", "integrating", "discovering", "performing", "predicting", "determining", "outputting", "identifying", "analyzing", "using", "assigning", "disturbing", "increasing", "adjusting", "incorporating", "simulating", "decreasing", "distributing", "specifying", "extracting", "displaying", "executing", "implementing", and "managing", or the like, may refer to the action and processes of a computer system, or other electronic device, that transforms data represented as physical (electronic, magnetic, or optical) quantities within some electrical device's storage into other data similarly represented as physical quantities within the storage, or in transmission or display devices. These and similar terms are to be associated with the appropriate physical quantities and are merely convenient labels applied to these quantities.

Embodiments disclosed herein also relate to an apparatus for performing the operations herein. This apparatus may be specially constructed for the required purposes, or it may comprise a general-purpose computer selectively activated or reconfigured by a computer program or code stored in the computer. Such a computer program or code may be stored or encoded in a computer readable medium or implemented over some type of transmission medium. A computer-readable medium includes any medium or mechanism for storing or transmitting information in a form readable by a machine, such as a computer ('machine' and 'computer' are used synonymously herein). As a non-limiting example, a computer-readable medium may include a computer-readable storage medium (e.g., read only memory ("ROM"), random access memory ("RAM"), magnetic disk storage media, optical storage media, flash memory devices, etc.). A transmission medium may be twisted wire pairs, coaxial cable, optical fiber, or some other suitable transmission medium, for transmitting signals such as electrical, optical, acoustical or other form of propagated signals (e.g., carrier waves, infrared signals, digital signals, etc.)).

Furthermore, modules, features, attributes, methodologies, and other aspects can be implemented as software, hardware, firmware, or any combination thereof. Wherever a component of the present techniques is implemented as software, the component can be implemented as a stand-alone program (e.g., set of instructions), as part of a larger program, as a plurality of separate programs, as a statically or dynamically linked library, as a kernel loadable module, as a device driver, and/or in every and any other way known now or in the future to those of skill in the art of computer programming. Additionally, the invention is not limited to implementation in any specific operating system or environment.

As used herein, "and/or" placed between a first entity and a second entity means one of (1) the first entity, (2) the second entity, and (3) the first entity and the second entity.

Multiple elements listed with "and/or" should be construed in the same fashion, i.e., "one or more" of the elements so conjoined.

As used herein, "displaying" includes a direct act that causes displaying, as well as any indirect act that facilitates displaying. Indirect acts include providing software to an end user, maintaining a website through which a user is enabled to affect a display, hyperlinking to such a website, or cooperating or partnering with an entity who performs such direct or indirect acts. Thus, a first party may operate alone or in cooperation with a third party vendor to enable the reference signal to be generated on a display device. The display device may include any device suitable for displaying the reference image, such as without limitation a CRT monitor, a LCD monitor, a plasma device, a flat panel device, or printer. The display device may include a device which has been calibrated through the use of any conventional software intended to be used in evaluating, correcting, and/or improving display results (e.g., a color monitor that has been adjusted using monitor calibration software). Rather than (or in addition to) displaying the reference image on a display device, a method, consistent with the invention, may include providing a reference image to a subject. Providing a reference image may include creating or distributing the reference image to the subject by physical, telephonic, or electronic delivery, providing access over a network to the reference, or creating or distributing software to the subject configured to run on the subject's workstation or computer including the reference image. In one example, the providing of the reference image could involve enabling the subject to obtain the reference image in hard copy form via a printer. For example, information, software, and/or instructions could be transmitted (e.g., electronically or physically via a data storage device or hard copy) and/or otherwise made available (e.g., via a network) to facilitate the subject using a printer to print a hard copy form of reference image. In such an example, the printer may be a printer which has been calibrated through the use of any conventional software intended to be used in evaluating, correcting, and/or improving printing results (e.g., a color printer that has been adjusted using color correction software).

As used herein, "exemplary" is used exclusively herein to mean "serving as an example, instance, or illustration." Any aspect described herein as "exemplary" is not necessarily to be construed as preferred or advantageous over other aspects.

As used herein, the term "hydrocarbons" are generally defined as molecules formed primarily of carbon and hydrogen atoms such as oil and natural gas. Hydrocarbons may also include other elements or compounds, such as, but not limited to, halogens, metallic elements, nitrogen, oxygen, sulfur, hydrogen sulfide ($H_2S$), and carbon dioxide ($CO_2$). Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models, and determining the likely locations for hydrocarbon reservoirs within the subsurface. The measurement data may include seismic data, gravity data, magnetic data, electromagnetic data, and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of the data to identify preferred development approaches and methods. By way of example, hydrocarbon development may include modeling of the subsurface formation and extraction planning for periods of production, determining and planning equipment to be utilized and techniques to be utilized in extracting the hydrocarbons from the subsurface formation, and the like.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as the injection of gas or liquid for increasing drive pressure, mobilizing the hydrocarbon, or treating the well by, for example, chemicals, or hydraulic fracturing the wellbore to promote increased flow, well servicing, well logging, and other well and wellbore treatments.

As used herein, "hydrocarbon reservoirs" include reservoirs containing any hydrocarbon substance, including for example one or more than one of any of the following: oil (often referred to as petroleum), natural gas, gas condensate, tar, and bitumen.

As used herein, "hydrocarbon management" or "managing hydrocarbons" or "hydrocarbon operations" includes refers to any activity associated with hydrocarbon extraction, hydrocarbon exploration, hydrocarbon development, and/or hydrocarbon production.

As used herein, "machine-readable medium" refers to a medium that participates in directly or indirectly providing signals, instructions and/or data. A machine-readable medium may take forms, including, but not limited to, non-volatile media (e.g. ROM, disk) and volatile media (RAM). Common forms of a machine-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, and other media from which a computer, a processor or other electronic device can read.

As used herein, "subsurface" means beneath the top surface of any mass of land at any elevation or over a range of elevations, whether above, below or at sea level, and/or beneath the floor surface of any mass of water, whether above, below or at sea level.

As used herein, "subsurface model" refers to a model of a subsurface region. A subsurface model may include a reservoir model, a geomechanical model, a watertight model, and/or a geologic model. The subsurface model may include subsurface data distributed within the model in one-dimensions (e.g., a stratigraphic column), two-dimensions (e.g., distributed into a plurality of cells, such as mesh elements or blocks), three-dimensions (e.g., distributed into a plurality of voxels), or four or more dimensions.

As used herein, "geologic model" is model (e.g., a two-dimensional model or a three-dimensional model) of the subsurface region having static properties and includes objects, such as faults and/or horizons, and properties, such as facies, lithology, porosity, permeability, or the proportion of sand and shale.

As used herein, "reservoir model" is a model (e.g., a two-dimensional model or a three-dimensional model) of the subsurface that in addition to static properties, such as porosity and permeability, also has dynamic properties that vary over the timescale of resource extraction, such as fluid composition, pressure, and relative permeability.

As used herein, "geomechanical model" is a model (e.g., a two-dimensional model or a three-dimensional model) of the subsurface that contains properties, such as static properties, and may model responses to changes in stress, such as mechanical response. The static properties may include properties, such as rock compressibility and Poisson's ratio, while the mechanical response may include compaction, subsidence, surface heaving, faulting, and seismic event, which may be a response to of the rock to fluid injection and extraction operations.

As used herein, "zone", "structural blocks", "container", or "compartment" are a defined space, area, or volume contained in the framework or model, which may be bounded by one or more objects or a polygon encompassing an area or volume of interest. The volume encompassed by the zone may include similar properties. For example, a reservoir model may be vertically split into a set of mutually exclusive zones bound by stratigraphic surfaces and/or may be laterally split into structural blocks bound by fault surfaces. The intersection of a zone and a structural block may form a compartment. A container may be a three-dimensional subvolume of the model.

As used herein, "mesh" or "grid" is a representation of a region of space (e.g., two-dimensional domain or three-dimensional domain), which may include nodes that form mesh elements, such as polygons or polyhedra, disposed within the region (e.g., a volumetric representation). The mesh may represent surfaces, horizons, faults, and/or other objects by a set of nodes, which may include various mesh elements in the form of polygons or polyhedra, disposed within the region. Properties may be assigned to or associated with the mesh elements. A mesh element may include nodes, edges, faces, and in some cases, cells.

As used herein, a "property" is a categorical, discrete, or continuous attribute assigned to elements, such as mesh elements (e.g., nodes, faces, edges, or cells), in a model. Example properties include coordinates (x, y, z, or t), static properties (e.g., rock type, porosity, permeability), or dynamic properties (e.g., pressure or fluid composition).

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, and/or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear, slip, and/or energy release of the rock as a function of time and space in response to boundary conditions, such as displacements, tractions, or heat or fluid pressures applied to a geomechanical model with specified initial conditions.

As used herein, the term "fracture" refers to any local separation or a discontinuity plane in a geological formation. A fracture may be a fault/shear (Mode II and/or Mode III) fracture or joint/opening (Mode I) fracture. The term "joint" or "Mode I fracture" refers to a fracture in rock where there has been no or insignificant lateral movement in the plane of the fracture (up, down or sideways) of one side relative to the other. See e.g., Klerck et al. (2004), "Discrete fracture in quasi-brittle materials under compressive and tensile stress states", *Methods in Applied Mechanics and Engineering*, Vol. 193, pp. 3035-3056. Thus, a joint or Mode I fracture is different from a fault or shear fracture (Mode II or Mode III) which is defined as a fracture in rock where one side slides laterally past the other.

As used herein, the term "natural fracture" refers to any fracture in the subsurface that is not produced by human activities, such as drilling, incidental or intentional hydrofracturing, core handling, etc. The term "natural fractures" is used to distinguish fractures (i.e., displacement discontinuity in a geologic formation, such as a joint, fissure, crevice or a fault) that form due to geological causes such as tectonic loading (e.g., regional compression/extension), folding, faulting, slip on pre-existing surfaces, pore pressures, erosion/unloading, material heterogeneity, and heating or cooling of joints, from those fractures that are formed due to human activities. Natural fractures are typically a result of stress exceeding the rock strength, causing the rock to lose cohesion along its weakest plane (e.g., the tensile stress exceeds the rock strength).

As used herein "damage" refers to a zone of intensely deformed and/or fragmented rock. This zone can accommodate intense slip, opening, or fragmentation. Damage can either be localized in a relatively narrow band or it may involve large material regions that fail and fragment simultaneously.

As used herein "mode of fracture origin" refers to the mode (e.g. Mode I, Mode II, or Mode III) by which fracture initiation occurred. For example, a fracture that initiated as Mode I can later close and accommodate slip along the fracture faces as in Mode II; however the mode of origin of the fracture remains Mode-I.

As used herein, the term "hydraulic fracture" refers to displacement discontinuities within the geologic formation that are created from human/manmade operations, such as wellbore operations. For example, the wellbore operations involve drilling and performing a well-stimulation technique in which rock is fractured by a pressurized fluid (e.g., injecting the fluid to increase the pressure to fractures or gaps in the formation).

As used herein the term "region" refers to an area or volume of geologic interest, and may be associated with the geometry, attitude, and arrangement of the area or volume at any scale (e.g., millimeters (mm) to kilometers (km)). A region may have characteristics, such as folding, faulting, cooling, unloading, and/or fracturing that has occurred therein. In the context of a subsurface model, a region may be represented as a contiguous part of the model, such as a contiguous two-dimensional or three-dimensional part of the model.

As used herein, the term "Gauss point" refers to a point within a finite element where variables, such as stress or strain, are calculated.

As used herein the term "heterolithic" refers to vertical stacks of rocks with different material properties.

As used herein "forward mechanical models" include FEM-DEM, DEM, and/or continuum analysis where rock layers are deformed from an initial position to a final geometry.

As used herein, "DEM" refers to Discrete Element Methods, which are numerical methods for computing the motion of large numbers of particles or elements, which represent a subsurface region herein.

As used herein, "FEM" refers to Finite Element Methods, which are numerical techniques for solving engineering problems by dividing a region into smaller elements such that the combined properties of the smaller elements contain the properties of the region.

As used herein the term "restoration analysis" refers to unfolding, unfaulting, and re-ordering (e.g., translations and rotations) of deformed rocks back to an initial, primary depositional geometry.

As used herein the term "high-risk fracture zone" refers to a region of rock where natural fractures are most likely to occur.

As used herein "mechanically driven factors" refer to: folding, faulting, material heterogeneity, regional compression, presence of material contrast and inclusions, pore-pressures, slip along preexisting discontinuities, and the like.

As used herein the term "macromechanical geological load" refers to stresses and displacements for a large or regional scale, which represent the stresses and/or displacements for a larger region than the region being modeled. By way of example, a zone may be defined by a Volume A, the macromechanical geologic loading represents the stresses and/or displacements associated with a Volume B, where Volume B is larger than the defined Volume A and may contain Volume A. These loads may represent stresses and/or displacements for a defined region, which are based on a global model that represents the tectonics of the region, geomechanical modeling, burial history, in-situ stress measurements, geologic interpretations of stress changes over time, which may be based on geological reconstructions and/or a global model that represents the tectonics of region, and/or any combination thereof.

As used herein, "continuum" refers to numerical representation of a subsurface zone in which variables such as stress vary smoothly and no explicit discontinuities are simulated.

As noted above, natural fractures that occur in the subsurface may be in subsurface regions that do not have a history of high strain. Such natural fractures may influence hydrocarbon recovery, water encroachment, and/or interact with hydraulic fractures during stimulation. As a result, prediction and modeling of natural fractures is useful to enhance hydrocarbon management. For example, the prediction of natural fractures may be used to enhance hydrocarbon production by determining well injection rates, determining well extraction rates, and/or providing additional information for previous and future hydrocarbon management decisions, which may provide guidance on hydrocarbon-related acts or activities.

The present techniques provide enhancements to methods and systems for modeling and predicting natural fractures within the subsurface, and in particular methods and systems for modeling and predicting fractures due to stacking. As the subsurface includes various layers of material having different properties, natural fractures may be produced by gravity and mild tectonic loading of otherwise underformed strata in the subsurface due to mechanical property heterogeneity in layered or otherwise spatially complex geologic formations. When such layers are mechanically linked, bonded, or partly bonded during loading, stresses and strains are transferred between layers creating tractions on the layer interfaces. Within a stack of layered rocks, the layers with a relatively higher degree of brittleness can be subjected to shear tractions caused by the relatively higher lateral strains in a more compliant overlying or underlying adjacent layers. These lateral strains can induce tensional stresses in the brittle layers that can exceed the rocks tensile strength and fail, forming natural fractures.

The present techniques provide an enhanced process for modeling fractures due to stacking. In particular, the present techniques may predict and model natural fractures using mechanical rock property information from well logs and/or simulating farfield loading conditions, which may use basin history. By way of example, the process may include predicting natural fractures in a subsurface region, which includes: creating a multi-layer model of the subsurface region (e.g., including basin history over time period to predict fractures); populating the multi-layer model with mechanical rock properties; applying one or more loads to the multi-layer model; determining a stress in each layer for each of a plurality of loads; determining a tensile failure at one or more layers in the multi-layer model for each of a plurality of loads to create one or more natural fractures into the multi-layer model; calculating analytical results for the multi-layer model based on the tensile failures (e.g., determining one or more metrics of natural fractures for the layers in the multilayer model at different loads based on the tensile failures); calculating numerical results for the multi-layer model based on the tensile failures (e.g., modeling natural fractures, which may include explicitly modeling the natural fractures); creating a representation of the subsurface region with one or more of the numerical and analytical results; and performing hydrocarbon management for the subsurface region based on one or more of indications (e.g., fracture characteristics, modeled natural fractures, tensile failures, and/or metrics). These steps may be repeated for different time-steps through a set period of time associated with the evolution of the basin history (e.g., burial and deformation history). Further, the method may include the bond strength between layers, cohesion, and/or friction in determining the one or more of indications.

In some embodiments, the process may include creating a multi-layer model from measurements from subsurface wireline logs or core data; populating the multi-layer model with mechanical rock properties; applying loads to the multi-layer model; solving for stress in each layer at different times (e.g., at one or more time steps) and/or different loads; determining tensile failure at each layer in the multi-layer model for each time; calculating fracture characteristics or metrics (e.g., one or more of fracture stacking potential; normalized fracture stacking potential; multi-scale fracture stacking potential; total fracture stacking potential and any combination thereof) for the layers in the multi-layer model; optionally, creating a map of the subsurface with one or more natural fractures, tensile failure and/or metrics; and performing hydrocarbon management or hydrocarbon operations for the subsurface based on one or more of fracture characteristics, tensile failures, and/or metrics. Further, applying loads may involve (i) changing loads over time to reflect interpretation of actual geologic loads for the location of interest based on a burial and deformation history; and (ii) changing mechanical rock properties during loading to reflect changes in mechanical compaction and chemical induced changes (e.g., cements and/or dissolution to the rocks of interest over time).

The method may also include creating or obtaining a stratigraphic column (e.g., one-dimensional multi-layer model) populated by mechanical rock properties, which may be derived from the wireline or core data; applying loads to the column and solving for stress in each layer of the column; determining the tensile failure during the time from deposition to present day for each layer in the column (e.g., following the defined load and mechanical rock property evolution history); calculating metrics associated with the fracture characteristics, such as fracture stacking potential, total fracture stacking potential, normalized fracture stacking potential, and/or multi-scale fracture stacking potential; creating a representation of the subsurface based on one or more of the calculated metrics or determined tensile failures; performing hydrocarbon management based on the representation. Further, solving for stress in each layer may be subject to: (i) changing loads over time to reflect geologic interpretations for the location of interest based on a burial and deformation history; (ii) changing mechanical rock properties during loading to reflect mechanical compaction and chemical induced changes to the layers of interest over time; and (iii) changing the degree of bonding between layers over time. The representation may be a map of selected intervals of interest, which is created by plotting calculated metrics for each well and interpolating between wells and/or plotting of the explicitly modeled natural fractures.

The representation of the subsurface based on one or more of the fracture characteristics or other indications, modeled natural fractures, metrics, and/or determined tensile failures may involve displaying a map or chart associated with the natural fractures. The representation may explicitly model natural fractures and/or provide a graph or chart of one or more fracture characteristics, for example. The representation may also create maps of predicted natural fracture characteristics (e.g. length, height, intensity, aperture etc.). The representation may be a two-dimensional image, a three-dimensional image, table, graph, and/or chart.

The fracture characteristics or metrics may include one or more of fracture stacking potential; normalized fracture stacking potential; multi-scale fracture stacking potential; total fracture stacking potential; and any combination thereof. As an example, the multi-scale fracture stacking potential (MSP) index may be used to quantify the variability of natural fracture potential in a zone or region. The MSP may be calculated for each of the zones associated with a well. In this example, a zone is contiguous non-zero fracture potential. The MSP may be normalized (e.g., to a valve between 0 and 1) to idealize maximum possible variability. Further, a proxy may be used for fracturing at different scales (e.g., heights). As an example, the MSP may be calculated using equation (E1) below:

$$MSP = \sum_{n=1}^{\text{\# of samples}} \frac{\text{Independent Peak Amplitude}}{\left(\text{Reference } FP * \left(\frac{\text{Zone Length}}{2} - 1\right)\right)}; \quad (E1)$$

where n is an integer for the number of samples; Independent Peak Amplitude is the highest value for a continuous non-zero section of the fracture potential response for a zone of interest (e.g., associated with a continuous portion or section of the wellbore or subsurface); Reference FP is highest value for the fracture stacking potential over all of the samples; and Zone Length is length of the zone of interest.

As an example, in some embodiments Equation E1 can be refined and the multi-scale fracture stacking potential (MSP) index may be calculated according to equation (E1-A) below:

$$MSP = \sum_{n=1}^{\text{\# of samples}} \frac{|FP_n - FP_{n-1}|}{\left(C * \left(\frac{L_{zone}}{2} - 1\right)\right)}; \quad (E1-A)$$

where n is an integer of the number of samples; FP is the value for the fracture stacking potential at location n; C is the highest value for the fracture stacking potential over all of the samples for the zone; and $L_{zone}$ is the length of the zone of interest.

As another example, the total fracture stacking potential (TSP) index may be used to quantify the magnitude and variability of fracture potential over an interval containing several zones or regions. The TSP may be a depth-normalized sum of MSP and area fraction (NFP). The TSP may be utilized to compare between wells within the same basin or across different basins. The TSP may be calculated according to equation (E2) below:

$$TSP = \sum_{n=1}^{\text{\# Zones}} \left(MSP_n + \frac{FP_n}{C * (L_{zone_n})}\right) * \frac{L_{zone_n}}{L_{interval}}; \quad (E2)$$

where n is number of zones; $MSP_n$ is the multi-scale fracture stacking potential for the $n^{th}$ zone; $FP_n$ is the fracture stacking potential for the $n^{th}$ zone; C is scaling constant or normalization factor (e.g., 0.3 to 1.0 may be the typical values); $L_{zone_n}$ is length of the $n^{th}$ zone; and $L_{interval}$ is total length of the zones in the interval. The present techniques may be further understood with reference to the FIGS. 1 to 11 below.

FIG. 1 is a flow chart 100 of a method in accordance with the present techniques. In this flow chart 100, the method involves an enhanced process for modeling natural fractures due to stacking. The method represents the lateral strains that may induce tensional stresses in the brittle layers that can exceed the rocks tensile strength and fail, which may result in the formation of natural fractures. Accordingly, the method models natural fractures due to stacking by using mechanical rock property information, which may be from measurements (e.g., well logs or core data) and simulates the loading conditions using basin history. By way of example, the method involves constructing and using a multi-layer model, as shown in blocks 102 to 108, determining tensile failures and calculating results, as shown in blocks 110 to 114, and creating representations and using the results to perform hydrocarbon management for the subsurface, as shown in blocks 116 and 118.

The method begins by constructing and using a multi-layer model, as shown in blocks 102 to 108. In block 102, a multi-layer model is created. The multi-layer model may include various layers that each have different properties (e.g., associated with different rock types). The multi-layer model may be created from measurements obtained from wireline logs and/or core data. As an example, the multi-layer model may be a one-dimensional stratigraphic column. Then, at block 104, the multi-layer model is populated with mechanical rock properties. The mechanical rock properties may be elastic properties, plasticity properties, friction properties, and/or viscous properties. In some embodiments the mechanical rock properties are elastic mechanical rock properties, which may be different for each layers, and may include Young's modulus, shear modulus, bulk modulus and Poisson's ratio. The population of the multi-layer model may include assigning mechanical rock properties derived from the measurements (e.g., the subsurface wireline logs or core data). At block 106, loads are applied to the multi-layer model. The loading may involve applying two or more loads to the column (e.g., vertical and horizontal, 2D or 3D). As an example, the applied loads may include applying horizontal stresses, vertical stresses, thermal stresses, and/or pore pressure stresses. In particular, the different loading may include applying two or more loadings to the multi-layer model. Once the load is applied, the stress is solved in each layer as shown in block 108. Solving the stress in each layer may include computing the total stress for each layer.

Once the stresses are calculated for the various loads, the determination and calculation of tensile failures and results is performed, as shown in blocks 110 to 114. The tensile failures may be determined for each layer in the multi-layer model, as shown in block 110. The determination of the tensile failures may include calculating the tensile failures for each layer and may include determining tensile failures in the layers of the multi-layer model (e.g., column). In particular, the tensile failure is determined by comparing the calculated stress to a tensile failure stress to determine if the calculated stress exceeds tensile failure stress to indicate formation of one or more natural fractures. Further, if the process involves different time steps, the determining of the tensile failure may be performed for each time step from deposition to present day position, which may follow the defined load and mechanical rock property evolution history through various time steps. At block 112, analytical results are calculated for the multi-layer model based on the tensile fractures. The calculation of analytical results may include computing the metrics for one or more layers. The calculation of the analytical results is described further in FIG. 2 below. At block 114, numerical results are calculated for the multi-layer model based on the tensile fractures. Calculating the numerical results may include modeling the formation of natural fractures. Further, the numerical results may be performed for specific zones based on the review of the analytical results. The calculation of the numerical results is described further in FIG. 3 below.

The results may be provided and used for hydrocarbon management and hydrocarbon operations, as shown in blocks 116 and 118. At block 116, a representation of the subsurface region (e.g., a table, chart or a map) is created with one or more the analytical results, numerical results, tensile failures, or any combination thereof. For example, the representation may be displayed by selecting intervals of interest and plotting one or more of the results (e.g., one or more selected metrics and/or modeled natural fractures). Then, the values of the selected results may be contoured over a map for each well in an area of interest, which may be displayed. Then, at block 118, the one or more numerical results and/or the analytical results are used in hydrocarbon management for the subsurface. For example, the one or more of the numerical results and/or the analytical results, which may include a map or other representation, may be used with other factors to make decisions about managing the hydrocarbons. In particular, the decisions may involve acreage capture, drilling well location optimization (e.g., sweet spot identification) and/or completion planning, such as targets for selective perforation, hydraulic fracturing or landing zone decisions for horizontal wells.

Beneficially, the present technique provides various enhancements for hydrocarbon operations. For example, the process provides analytical results and/or numerical results, which may be utilized to refine the understanding of the natural fractures within the subsurface. The analytical results may include calculating one or more metrics that may provide additional insights into the natural fractures formed within the subsurface region.

To further enhance the method, applying the loads and the solving the stress for the multi-layer model may include adjusting the parameters being modeled (e.g., loads, mechanical rock properties and/or layers) for one or more of the time steps. By way of example, the method may include performing a simulation by repeating blocks 106, 108, 110, 112, and 114 for each time step and then updating the mechanical rock properties and/or loading in the model for a subsequent iteration. In particular, the simulation may include loading the multi-layer model at a first time step and solving for stress, determining tensile failures and calculating analytical results, calculating numerical results for the first time step. Then, at a subsequent time step (e.g., a second time step), the properties may be updated and/or loading may be changed and the steps repeated for the additional time step. The changes in properties and/or loading may reflect interpretation of actual geologic loads for a location of interest based on a burial and deformation history; and/or adjusting the mechanical rock properties may reflect changes in mechanical compaction and chemical induced changes (cements and/or dissolution) to the rocks of interest over time.

Figure 2:
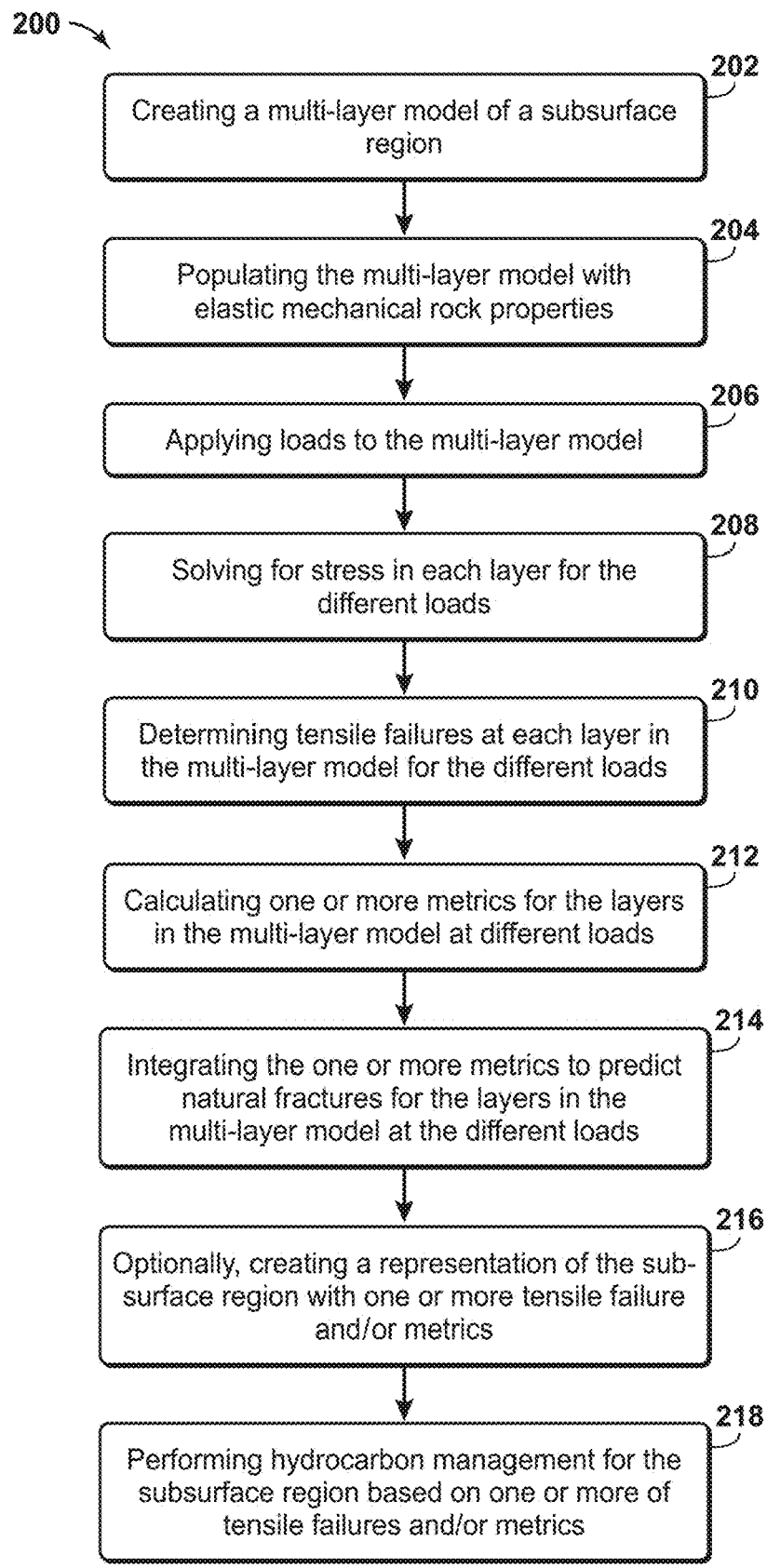
FIG. 2 is a flowchart of an analytical method in accordance with the present techniques.

FIG. 2 is a flow chart 200 of a method of calculating analytical results in accordance with embodiments of the present techniques. In this flow chart 200, the method involves a further enhancement to the calculation of the analytical results in block 112 of FIG. 1. In particular, this method involves calculating metrics and further classifying the metrics to predict natural fractures. By way of example, the method involves constructing and using a multi-layer model, as shown in blocks 202 to 208, determining, calculating and classifying metrics, as shown in blocks 210 to 214, and creating representations and using the results to perform hydrocarbon management for the subsurface, as shown in blocks 216 and 218.

The method begins by constructing and using a multi-layer model, as shown in blocks 202 to 208. In block 202, a multi-layer model is created. The multi-layer model may be created in a manner similar to the creation of the multi-layer model in block 102 of FIG. 1. Then, at block 204, the multi-layer model is populated with mechanical rock properties. The population of the multi-layer model may be performed in a manner similar to block 104 of FIG. 1. At block 206, loads are applied to the multi-layer model. The applying loads may be performed in a similar manner to block 106 of FIG. 1. Then, the stress is solved in each layer for the different loads, as shown in block 208. Solving the stress in each layer may be performed in manner similar to block 108 of FIG. 1.

Once the stresses are calculated for the various loads, the determination, calculation and classification of the metrics and/or tensile failures may be performed, as shown in blocks 210 to 214. For example, the tensile failures may be determined for each layer in the multi-layer model for different loads, as shown in block 210. The determination of the tensile failures may be performed in a manner similar to that performed in block 110 of FIG. 1. At block 212, one or more metrics may be calculated for the layers in the multi-layer model for different loads. The calculation of one or more metrics may include computing the metrics for one or more layers for each load and may be used to interpret the layers in the multi-layer model. The metrics may be calculated to interpret the fracture characteristics of layers in the multi-layer model or to represent cumulative fracture characteristics over some selected depth interval of the subsurface region (e.g., a well, a particular reservoir, a landing zone range or range of perforation targets). The metrics may include one or more of fracture stacking potential; normalized fracture stacking potential; multi-scale fracture stacking potential; total fracture stacking potential and any combination thereof. Then, in block 214, the one or more metrics may be integrated to predict natural fractures for the layers of the multi-layer model at the different loads. The integration may include combining the one or more of the metrics and/or tensile failures.

The analytical results (e.g., the metrics) may be provided and used for hydrocarbon management or hydrocarbon operations, as shown in blocks 216 and 218. At block 216, a representation of the subsurface region is created with one or more tensile failures and/or metrics. Similar to block 114 of FIG. 1, the representation may be displayed by selecting intervals of interest and plotting one or more metrics (e.g., one or more selected metrics). Then, the values of the selected metrics for each well in a map area of interest may be displayed as a contoured map. Then, at block 218, the tensile failures and/or metrics are used in hydrocarbon management for the subsurface. Similar to block 116 of FIG. 1, the tensile failures and/or metrics, which may be used with other factors, may be used to make decisions about managing the hydrocarbons, such as acreage capture, drilling well location optimization (e.g., sweet spot identification) and/or completion planning, such as targets for selective perforation, hydraulic fracturing or landing zone decisions for horizontal wells.

Beneficially, the analytical results provide various enhancements. For example, the metrics may be used to provide additional insights into the formation of natural fractures.

To further enhance the method, applying the loads and solving the stress for the multi-layer model may include adjusting the parameters being modeled (e.g., loads, mechanical rock properties and/or layers) for one or more of the time steps. By way of example, the method may include performing a simulation by repeating blocks 206, 208, 210, 212, and 214 for each time step and then updating the mechanical rock properties in the model for a subsequent iteration. In particular, the simulation may include loading the multi-layer model at a first time step and solving for stress, determining tensile failures and calculating metrics to predict natural fractures, and classifying the metrics for the first time step. Then, at a subsequent time step (e.g., a second time step), the properties may be updated and/or loading may be changed. The changes in properties and/or loading may reflect interpretation of actual geologic loads for a location of interest based on a burial and deformation history; and/or adjusting the mechanical rock properties may reflect changes in mechanical compaction and chemical induced changes (cements and/or dissolution) to the rocks of interest over time.

Figure 3:
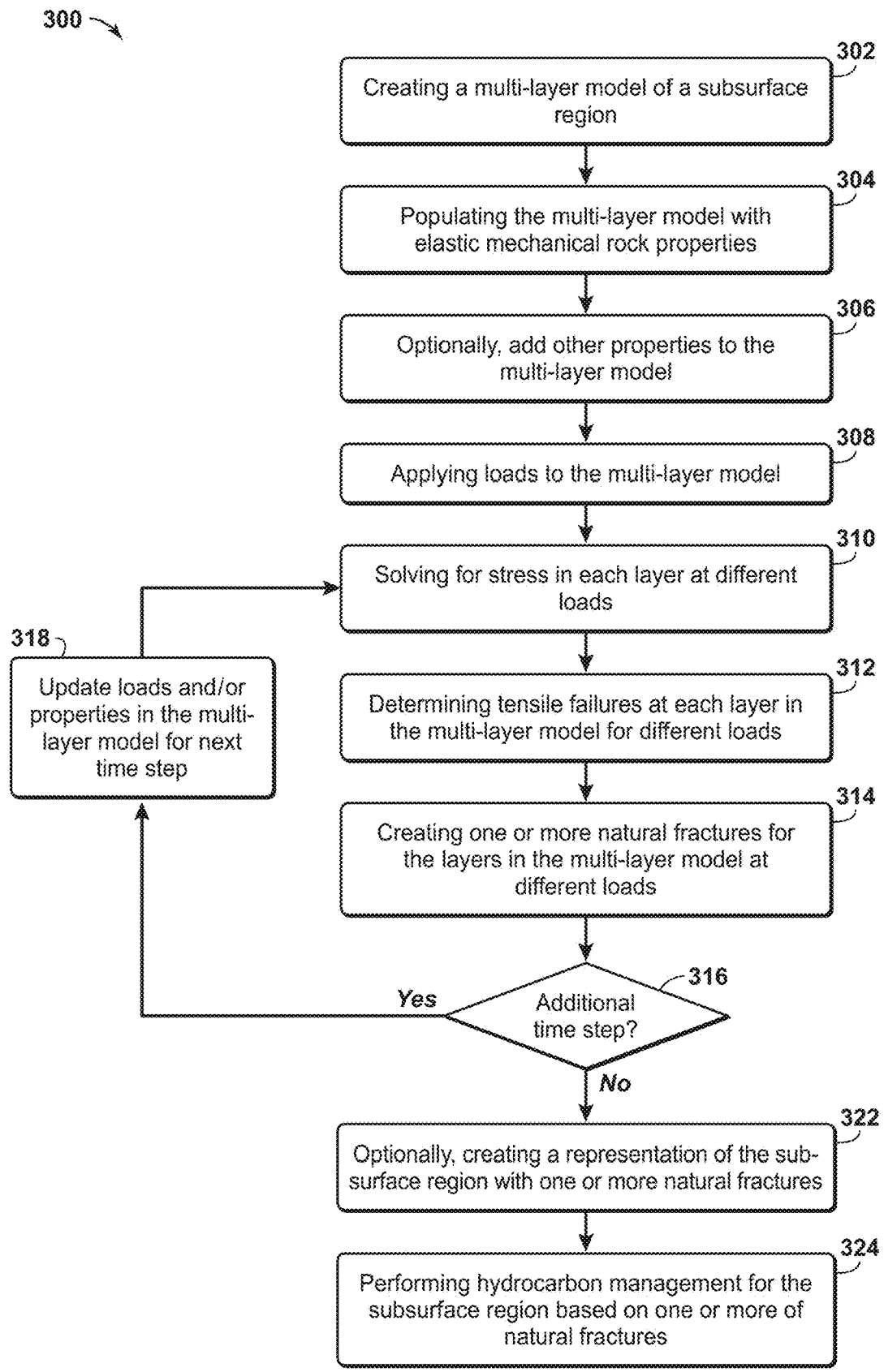
FIG. 3 is a flowchart of a numerical method in accordance with the present techniques.

FIG. 3 is a flow chart 300 of a method of calculating numerical results in accordance with embodiments of the present techniques. In this flow chart 300, the method involves a further enhancement to the process of block 114 of FIG. 1. In particular, this method involves creating natural fractures, which are modeled. By way of example, the method involves constructing and initializing a multi-layer model, as shown in blocks 302 to 306, simulating creation of natural fractures, as shown in blocks 308 to 318, and creating representations and using the created natural fractures to perform hydrocarbon management for the subsurface, as shown in blocks 320 and 322.

The method begins by constructing and using a multi-layer model, as shown in blocks 302 to 308. In block 302, a multi-layer model is created. The multi-layer model may be created in manner similar to the creation of the multi-layer model in block 102 of FIG. 1. Then, at block 304, the multi-layer model is initially populated with mechanical rock properties, such as elastic mechanical rock properties. The population of the multi-layer model may be performed in a manner similar to block 104 of FIG. 1. At block 306, other properties may be added to the multi-layer model. The other properties may include interlayer frictional properties and inelastic rock properties, for example.

Once the multi-layer model is created, the multi-layer model is then utilized in a simulation to create natural fractures, as shown in blocks 308 to 316. At block 308, loads are applied to the multi-layer model. The applying loads may be performed in a similar manner to block 106 of FIG. 1. Then, the stress is solved in each layer for the different loads, as shown in block 310. Solving the stress in each layer may be performed in manner similar to block 108 of FIG. 1. Then, tensile failures may be determined for each layer in the multi-layer model for different loads, as shown in block 312. The determination of the tensile failures may be performed in a manner similar to that performed in block 110 of FIG. 1. At block 314, one or more natural fractures may be created for the layers in the multi-layer model at the different loads. Then, in block 316, a determination is made whether additional time steps are present. If the time steps are not complete, one or more of the loads, properties or any combination thereof may be updated for the next time step. The updating of the loads and/or properties may include adjusting the values of the vertical and horizontal stresses, thermal stresses and pore pressure and rock properties due to diagenesis.

Once the time steps are complete, the results may be provided and used for hydrocarbon management or hydrocarbon operations, as shown in blocks 320 and 322. At block 320, a representation of the subsurface region is created for the natural fractures. Similar to block 114 of FIG. 1, the representation may be displayed by selecting intervals of interest and plotting one or more natural fractures. Then, the natural fractures metrics for each well in a map area of interest may be displayed as a contoured map. Then, at block 322, the tensile failures and/or metrics is used in hydrocarbon management for the subsurface. Similar to block 116 of FIG. 1, the modeled natural fractures, which may be used with other factors, may be used to make decisions about managing the hydrocarbons, such as acreage capture, drilling well location optimization (e.g., sweet spot identification) and/or completion planning, such as targets for selective perforation, hydraulic fracturing or landing zone decisions for horizontal wells.

To provide the guidance on the locations and/or characteristics on natural fractures, the results may be generated and may be displayed as numerical results, analytical results and any combination thereof. These results may be for one-dimension (1D), two-dimension (2D) or three-dimension (3D). The numerical results and/or analytical results may provide explicit natural fractures or may compute one or more metrics (e.g., fracture stacking potential; normalized fracture stacking potential; multi-scale fracture stacking potential; and total fracture stacking potential).

By way of example, the determination of models for the numerical modeling may include enhancements in the generation of subsurface models. Accordingly, the present techniques may enhance subsurface models by characterizing natural fractures using a physics-based numerical model to simulate the genesis of natural fractures. In such an approach, physical laws such as conservation of linear momentum, material constitutive relationships, and fracture growth laws are utilized in the simulation which results in a prediction of fracture initiation, re-orientation, and intersection due to macromechanical geological processes. To manage subsurface uncertainties, the numerical methods may be combined with estimations of input probabilities and data observation to render a probabilistic description of natural fracture characterization.

By way of example, the construction of the numerical model may involve various steps. Once the subsurface model is created, a zone where the fracture characterization is to be performed is identified. Then, a multi-layer model is created for the identified zone. The creation of the multi-layer model may involve meshing the multi-layer model and specifying mechanical rock properties for each element in the mesh. Then, loads that reflect macromechanical geological processes may be applied to the multi-layer model. Once the loads are applied, a simulation (e.g., a physics based simulation) may be performed to simulate the genesis of natural fractures, which may involve various time steps in a set period of time. Once the multi-layer model is simulated, the simulation results may be output. The simulation results may include the multi-layer model at the various time steps and/or data generated at the various time steps, such as fracture geometry, aperture, connectedness, or effective permeability. The results may include fracture characterization, which may include fracture generation, fracture interaction, fracture intersection, and combinations thereof. The results are gathered, processed, and may be used in fracture characterization workflows for further analysis.

In certain configurations, the creation of the multi-layer model may involve various steps. By way of example, the multi-layer model creation may include the following steps of (i) defining a zone for numerical modeling; (ii) separating the model into multiple stratigraphic layers; (iii) constructing a mesh for the modeled domain (e.g., the identified zone); (iv) assigning material constitutive relationships for each of the stratigraphic layers in the multi-layer model. The simulation may be used to capture how stress changes in response to the deformation from macromechanical geological loads.

In certain embodiments, the simulation may include numerical simulation. In such simulations, the macromechanical geological loading is discretized into a number of loading steps, which involves iteratively solving the conservation of linear momentum equations and updating the fracture trajectories until none of the mesh elements breach or exceed the fracture initiation or propagation conditions. Determining whether a mesh element exceeds the fracture initiation or propagation criteria may include determining whether an estimated stress (e.g., from solving the conservation of linear momentum equations) is above a critical stress, minimizing the potential energy of the mesh elements, or other suitable fracture initiation and propagation laws. For example, if the stress exceeds a threshold, the mesh element breaks to form a fracture. By way of example, the simulation may include solving the conservation of linear momentum equation using interpolation and enrichment methods to compute information (e.g. stress) used to evaluate where the subsurface (e.g., rock) may fracture based on the fracture initiation and propagation laws, as described herein. The simulation may further comprise checking to determine if any mesh elements should to be identified as having fractures. For each mesh element or cluster of mesh elements that exceed the fracture initiation or propagation criterion, selecting at least one mesh element based on a selection criterion (e.g., mesh element that exceed the criterion by the largest amount) as the mesh element to fracture, determining a fracture surface direction in the mesh element(s) to be fractured based on the chosen law for fracture growth direction (e.g., by determining the minimal principal stress and having the fracture growth direction be the direction that is perpendicular to the minimal principal stress), and fracturing the identified mesh elements. The method may then be iteratively repeated to determine if changes in the fractured mesh elements have caused other mesh elements to exceed the fracture initiation and propagation criteria for the current loading step. Once no mesh elements exceed the fracture initiation and propagation criteria for the current loading step, the method may be repeated for additional loading and/or time steps.

In certain configurations, the process may involve solving one or more equations (e.g., stress equations). For example, a numerical simulation may be performed to capture the genesis of natural fracture. This may involve formulating and solving conservation of linear momentum balance equations. The conservation of linear momentum equations may include rock density, total stress, initial rock stress, effective stress applied on the rock skeleton, Biot's constant, identity second order tensor, thermal stress, pore pressure history, and combinations thereof. The stresses, with the exception of the effective stress, may be estimated from burial history or basin models, and they may serve as inputs to the simulation (e.g., may be used as loads for the multi-layered model). The effective stress is a function of rock deformation which is further dependent on the displacement solution (or unknowns) of the numerical simulation.

To solve the governing equation (e.g., conservation of linear momentum equations) using the Finite Element Method, Galerkin formulation may be used, which includes weight functions, jump operators, traction applied on the fractured surface and/or applied as a function of fracture opening, and combinations thereof. See, e.g., Thomas J. R. Hughes, The Finite Element Method, p. 1 to 676 (1987) ISBN-13: 978-0486411811.

To enhance the process, enrichment functions may be utilized to capture the discontinuity in the displacements. Accordingly, the simulation results may be interpolated, which may involve the use of enrichment functions which depend on shape functions defined at each node. Each enrichment function may be associated with individual nodes and may contribute to the interpolation of the displacement inside the fractured mesh element. While one term may be configured to provide a sufficiently accurate solution (e.g., converge within a specific threshold during mesh refinement) for continuous and smooth displacement field, other terms may be added to enhance or improve the interpolation of the discontinuity in the displacement field.

Accordingly, natural fractures within the subsurface model may be modeled using a physics-based numerical method for modeling the subsurface region which may comprise: obtaining a subsurface model associated with a subsurface region; identifying a zone in the subsurface model for fracture characterization; creating a multi-layer model for the selected zone; applying macromechanical geological loads to the multi-layer model; simulating the multi-layer model based on the loads; and outputting the fracture characterization results for the multi-layered model of the selected zone.

Creating the multi-layer model may include: (i) defining or identifying the zone for numerical evaluation (e.g., define shape to define the area to be evaluated and range of depth or defining a polygon for the volumes to be evaluated); (ii) separating the model into one or more stratigraphic layers; (iii) constructing a mesh for the zone; (iv) assigning material constitutive relationships for each of the stratigraphic layers. The method may further apply macromechanical geological loads that represent macromechanical geological processes to the multi-layer model.

Simulating the multi-layer model based on the macromechanical geological loads may include performing a plurality of loading steps, wherein each loading step comprises: (i) solving one or more conservation of linear momentum equations associated with the zone, which may involve using an enhanced interpolation and enrichment method to compute information (e.g., stress) used to evaluate where the rock may be fractured based on the fracture initiation and propagation criteria; (ii) determining if the solution for any of the mesh elements in the multi-layer model exceed the fracture initiation or propagation criterion; (iii) if the solution for all of the mesh elements does not exceed the fracture initiation or propagation criterion, continue to step (v); (iv) if the solution for any one of the mesh elements exceed the fracture initiation or propagation criterion (a) select the mesh element associated with the solution that exceeds the fracture initiation or propagation criterion by the largest absolute value as the mesh element to fracture; (b) determining fracture surface direction in the mesh element to be fractured based on fracture growth direction criterion; (c) calculating one or more level set values based on the fracture surface direction; (d) determining sub regions for the mesh element based on the one or more level set values; and (e) repeating to step (i) using the determined sub regions to represent the mesh element; and (v) storing the fracture characterization results for the loading step. Also, if this is not the last loading step, the load is incremented and the process repeats for the next loading step. However, if this is the last loading step, the simulation is completed. The method may further include identifying the zone for fracture characterization based on locations associated with subsurface locations having measured data, wherein the measured data may comprise core sample data, image logs, mini fracture test data, drill stem test data, and any combination thereof. The method may further comprise performing a hydrocarbon operation based on the results of the simulation, such as the fracture characterization results.

In other configurations, additional enhancements may be performed. For example, the mesh elements that have a solution that exceeds the fracture initiation or propagation criterion may be grouped or clustered to perform the steps of a) to e) for each of the respective clusters. The identification of the clusters may be performed after the solution has been calculated for the mesh elements and prior to determining if the solution for the conservation of linear momentum equations of the mesh elements exceed the fracture initiation or propagation criterion. Then, each of the clusters may perform the steps a) to e) in parallel or concurrently to lessen the computational time.

Once the subsurface model is obtained, one or more zones are identified and simulated to form fractures in respective multi-layer models. The identified zone may be a region or location where data observations are available for model calibration (e.g., core sample locations, image log locations, mini fracture test locations, and/or drill stem test locations), or a region where there is a potential drill site where a fracture characterization may be useful. Then, a multi-layer model is created for the identified zone. Once the multi-layer model is created, loads are applied to the multi-layer model to represent macromechanical geologic processes. The macromechanical geological loads may be determined from a user, geomechanical modeling, burial history, in-situ stress measurements, and/or geologic interpretations of stress changes over time, which may be based on geological reconstructions and/or a global model that represents the tectonics of region. The macromechanical geological loads may be represented by force and/or force over area or volume and include units such as mega-Pascal (MPa), for example.

A simulation is performed with the multi-layer model and loads are applied. The simulation may be performed for various time steps in a defined period of time to simulate the macromechanical geologic processes. The simulation may be used to model or represent fracture generation, fracture interaction and/or fracture intersection. As may be appreciated, loading increments may vary for different loading steps. For example, fine scale increments may be utilized, but may involve more iterations and provide a result that is more accurate. Coarse scale increments may lessen computation time and lessen the number of iterations, but may not provide results that are as accurate as the fine scale increments. Accordingly, the application of the macromechanical geological loads may involve performing the loading operations in various steps or operations, which may be adjusted between steps. By way of example, the initial steps may include performing coarse loading steps that may adjust the load by coarse scale increments that are larger than the fine scale increments in the fine loading steps. The fine scale increments may adjust the load by a fraction of coarse scale increments, such as half or less, as compared with the coarse scale increments. For instance, the coarse loading may include fifty MPa of stress that may be applied in increments of ten MPa, while the fine loading steps may include using increments of five MPa or less. The adjustment to the loading increment may be based on one of the fracture characterization results, such as fracture density, orientation, aperture, and/or spacing. For example, if the fracture characterization increases at a rate less than 10% between loading steps, the fine loading step may be used for the next loading step. Otherwise, the coarse loading step may be used for a simulation that takes less time. In other configurations, the adjustment may be based on characterizations being less than 20% of the threshold or less than 5% of the threshold, or other suitable user defined threshold. Preferably, the loading steps may be configured to be the same for each comparison.

Then, a determination is made whether any additional zones are to be simulated. If one or more additional zones are to be simulated, the process repeats to identify another zone. However, if no additional zones are to be simulated, the process outputs the fracture characterization results. The outputting of the fracture characterization results may include displaying the fracture characterization results, storing the fracture characterization results in memory, and/or adjusting the subsurface model to incorporate the fracture characterization results. As may be appreciated, the fracture characterization results may be integrated into a reservoir simulation, as noted below, or may be used independently for hydrocarbon operations.

In certain configurations of the present techniques, the creation of the multi-layer model may involve various steps. By way of example, the model preparation is composed of following steps. As a first step in creation of the multi-layer model, a zone is defined for numerical evaluation. The size of the zone may be determined by the user or within a range of measured data. It may be based on regions for hydrocarbon recovery and may be identified by defining a boundary polygon or mathematically defined region around a point. For example, the modeling of the genesis of natural fractures in a zone or reservoir may not be computationally practical or even necessary. This is because fractures separated by larger distances do not communicate with each other. As a result, these fractures may be ignored as the stresses do not meaningfully impact (e.g., are negligible) the respective calculation results. Accordingly, the locations of the zones that are defined for numerical evaluation may be locations where data observations are available for model calibration and/or zones that include a potential drill site where a characterization may be useful. Examples of data observation include core sample data, image logs, mini fracture test data, and/or drill stem test data. The data may be localized and may not be associated with larger volumes within the subsurface region.

In a second step of creating the multi-layer model, the multi-layer model may be separated into one or more multiple stratigraphic layers. These layers may be separated based on mechanical properties or the interface between layers. Each layer may have a constant or continuously changing material properties. The stratification may be performed based on well log data, other observed or measured data, and/or stratigraphic concepts.

In a third step of creating the multi-layer model, a mesh may be constructed for the zone. The mesh may or may not honor or be constrained to the layer interfaces. If the mesh does not honor the layer interfaces, the techniques, such as those described in U.S. Pat. No. 8,190,414, which is incorporated herein by reference, may be used to treat the intersection of mesh element and layer boundaries.

In a fourth step of creation of the multi-layer model, material constitutive relationships may be assigned for each layer in the model to capture how stresses change in response to the deformation. Constitutive relationships define how materials respond once a load is applied, or relate the deformation to the load, as is known to those skilled in the art. Examples of such constitutive models may include linear elastic models or Cam Clay models. These models may include parameters, such as Young's Modulus and Poisson's ratio. For example, the linear elastic models requires Young's Modulus and Poisson's ratio. Such parameters can be measured from core sample tests, derived from logs, or estimated from analog formations. The parameters may also be calibrated using observed data.

In addition, a fracture criterion may also be specified for each layer of the multi-layer model. The fracture criterion may control the conditions under which a fracture may be initiated and the direction in which the fracture may propagate. An example of fracture initiation may be Rankin criterion in which a critical tensile stress is defined and the fracture may be initiated if the computed stress exceeds the critical stress. An example of a fracture propagation direction law, which may be represented as a fracture propagation direction equation or expression, is that opening mode fractures open in a direction that is perpendicular to the minimal principal stress direction. Another example of a fracture propagation direction law, is that a fracture will extend in the direction that minimizes the potential energy. See, e.g., Blaise Bourdin, Gilles A. Francfort, Jean-Jacques Mango, *The Variational Approach to Fracture*, Journal of Elasticity, 91:p. 5 to 148 (2008).

After the multi-layer model is created, loads that represent macromechanical geological processes may be applied to the multi-layer model. If a basin or region scale deformation history is known, such as when a forward or structural restoration model is available, the strain information at the zone of interest may be extracted from the larger scale deformation map, and then used to apply the appropriate boundary conditions to the multi-layer model for the zone of interest. Otherwise, traction boundary conditions may be applied using burial history as a mechanism to apply the overburden stress. Other stresses may be applied using some assumption on the ratio between the overburden and horizontal stresses. Additionally, information from burial history, pore pressure history, and thermal history may be obtained from a user, memory or other modeling associated with the subsurface region.

To perform the simulation with the multi-layer model, various simulation procedures may be performed. The simulation may grow or interact fractures to comply with physics laws to manage the maximum and minimum potential energy. Further, the simulation may be completed if the stress of the rock is below the critical stress defined by the fracture propagation criteria; the loading steps are completed; growing fractures until the potential energy of the model is minimized; and/or performing a specific number of iterations. Further, the loads may be applied incrementally to equilibrate the rock. For example, in the numerical simulation, the macromechanical geologic loading may be discretized into a number of loading operations or steps. Within each operation, the conservation of linear momentum equation is iteratively solved and the fracture trajectories are updated until no mesh element or cell exceeds the fracture initiation or propagation conditions. As a specific example, the procedure within a loading step may include the following: (i) solving the conservation of momentum equation (e.g., using an interpolation and enrichment method for the displacement), which is described below in the solving the conservation of linear momentum equations operations along with in the discussion of equations (eq1) to (eq6); (ii) verifying whether any mesh elements should be fractured (e.g., based on calculated values compared to certain thresholds), if no such mesh element need to be fractures, proceed to step (vii); (iii) for each cluster of mesh elements that exceed the fracture initiation or propagation criterion, select the mesh element that exceed the criterion by the largest amount as the mesh element to fracture; (iv) determine fracture surface direction in mesh elements to be fractured based on the predetermined fracture criteria or equations for fracture growth direction; (v) fracture the identified cells; (vi) then, repeat back to step (i); and (vii) complete the current loading step.

As yet another configuration, the calculations of the fractures may be adjusted to represent one or more modes of failure, such as fracture may be a fault/shear (Mode II and/or Mode III) fracture or joint and/or opening (Mode I) fracture. The Mode I is described further below with reference to equations (e1) to (e6), but Mode II and/or Mode III may also be utilized in other configurations based on solving different equations.

As part of the simulation, a solve stress equation operation may be performed. For example, a numerical simulation may be performed to capture the genesis of natural fractures in the subsurface region of interest. In general, the numerical formation seeks to solve the conservation of linear momentum equation (e.g., stress balance equation) (eq1), $$\nabla \cdot \rho g = 0 \qquad (eq1)$$

where g is gravity, ρ is rock density, and σ is the total stress. The latter may further be decomposed into equation (eq2), $$\sigma = \sigma^{init} + \sigma' - \alpha p I + \sigma^T \qquad (eq2)$$

where $\sigma^{init}$ is the initial rock stress, $\sigma'$ is the effective stress applied on the rock skeleton, α is the Biot's constant, I is the identity second order tensor, and $\sigma^T$ is the thermal stress. All stresses except the effective stress can be estimated from burial history or basin model, and they serve as inputs to the numerical model. The effective stress is a function of rock deformation, which is further dependent on the displacement solution (or unknowns) of numerical model.

To solve the governing equation using the Finite Element Method, a standard Galerkin formulation may be applied to the governing equation (eq1), which results in the following integration form of the governing equation (eq3), $$\int_\Omega \nabla w \sigma' d\Omega + \sum_{i=1}^{N_f} \int_{\Gamma_i^D} [\![w]\!] t d\Gamma = -\int_\Omega \nabla w (\sigma^{init} - \alpha p I + \sigma^T) d\Omega + \int_{\Gamma^H} w h d\Gamma \qquad (eq3)$$

where w is the weight functions, [·] is the jump operator, t is the traction applied on the fractured surface and is a function of fracture opening, which in turn depends on the rock deformation to be sought, h is the surface traction, and $\Gamma^H$ is the surface where the surface traction is applied. In equation (e3), all terms on the left hand side depend on displacement unknowns, and terms on the right hand side may be computed from inputs. In other configurations, a force balance equation may be solved for the fractures.

To solve equation (eq3), one needs to evaluate each integration term element by element. In each element, the weight functions and the solution u are interpolated from their values at nodes. Inserting the interpolation of solution w and solution u into the equation (ne3) results in a matrix equation in the form of Ax=b, where A is a matrix (also known as the stiffness matrix), b is a vector computed from the right hand side of equation (ne3), and u contains all the displacement unknowns at each node. By solving this matrix equation, the solution of the displacement unknown is obtained. If nonlinear relationships are present in the constitutive model or traction condition, an iterative process may be performed to provide the solution converge to a final solution which satisfy equation (eq3) numerically.

Further, the present techniques provides an enhanced mechanism to interpolate the solution u. Shape functions may be used to interpolate solution u, which are smooth and continuous, but cannot approximate discontinuity well. For example, Belytschko et al. describes a jump function to captured displacement discontinuity for a single fracture. See, e.g., T. Belytschko and T. Black, "Elastic crack growth in finite elements with minimal remeshing," International Journal for Numerical Methods in Engineering, 45 (5): p. 601 to 620 (1999). The equation (eq4) is as follows:

$$u^h(x) = \sum_{i=1}^{N^e} N_i(x) u_i + \sum_{i=1}^{N^e} N_i(x) a_i (H(x) - H(x_i)) \qquad (ne4)$$

where $N^e$ is the number of nodes in a mesh element, x is the location, $N_i$ is the shape function of the node i, and $u_i$ is the displacement of the node i. The first summation term of equation (e4) is the same as regular FEM interpolation. This term is capable of providing sufficiently accurate solution for continuous and smooth displacement field. The second summation term of equation (e4) is added to enhance the interpolation of the discontinuity in the displacement field (e.g., an enrichment term). The approximation is achieved by employing the enriched degree of freedoms denoted as enriched degree of freedoms $a_i$ and the enrichment function H(x), which is a jump function defined as follows:

$$H(x) = \begin{cases} -1, & x \in \Omega^{e-} \\ 1, & x \in \Omega^{e+} \end{cases} \qquad (eq5)$$

where $\Omega^{e-}$ and $\Omega^{e+}$ are the positive and negative portion of an element that is cut by a fracture, respectively. Inserting equation (ne4) into standard continuous Galerkin form equation (ne3) results in a matrix equation with unknowns of not only displacement of the node $u_i$, but also enriched degree of freedoms $a_i$. The enriched degree of freedoms $a_i$ gauges the magnitude of the involvement of the enrichment function H(x) in the displacement field.

In operations when a mesh element is cut by a multitude of fractures with possible intersection, the following formula to interpolate the displacement is as follows in equation (eq6):

$$u^h(x) = \sum_{i=1}^{N^e} N_i(x) u_i + \sum_{k=1}^{N^f} \sum_{i=1}^{N^e} N_i(x) a_i^k (H_k(x) - H_k(x_i)) D_k(x) \qquad (eq6)$$

where $u^h$ is interpolation of displacement, k is the fracture, $H_k$ is the jump function for the fracture k, $D_k$ is a domain function for the fracture k, $N^e$ is number of nodes in the mesh element, i is the node, x is the location, $x_i$ is location of $i^{th}$ node, $u_i$ is displacement of the node i, $N^f$ is number of fractures, $a_i$ is enrichment unknown of the node i, and $N_i$ is the shape function of the node i. It is noted that when a first fracture is truncated by another fracture, such as a second fracture, the jump function of the first fracture may extend beyond the second fracture, even though the jump function may have no influence there. To suppress the influence of a jump function $H_k$ for the fracture k in subdomains where it should have no influence, the domain function $D_k$ for the fracture k is utilized, which is unity in the sub-element partitions attached to the fracture k, and vanishes elsewhere. This equation is capable of addressing multiple fractures.

The solution a has a different value in each of the sub-element domains within the mesh element. The terms involving integration over each element in equation (ne3) may be evaluated separately in each sub-element domain. The details of partitioning an element into sub-element is described further below.

To provide tacking fractures operations, the level set functions may be used to track growing fractures. Once level set functions are defined, elements are explicitly split to facilitate the numerical integration involved in equation (ne3).

To provide tracking fractures using level set function operations, each fracture may be associated with a level set function. For example, nodal level set values may be defined for two intersecting fractures. To lessen storage, the nodal value of each level set function may be defined only on the nodes of the elements that are intersected by fractures. Some nodes may have multiple values stored for different level set functions.

To grow or initiate fracture, nodal values of level set function may be assigned to new nodes in fractured mesh elements, which form sub regions within the respective mesh elements. In the event of fracture initiation in an element, the nodal values of the level set function of that element may be assigned as the signed distance function to the plane centered at the mesh element center and with the direction based on the stress condition. For example, if the fracture initiation condition predicts a fracture opening direction perpendicular to n, the level set function values may be assigned as equation (eq7):

$$\phi_i = (x_i - x_c) \cdot n \qquad (eq7)$$

where $\phi_i$ is the level set function of the node i, and $x_c$ is the location of the mesh element center.

When a fracture needs to grow into a new mesh element, the level set function is updated using global schemes. For example, one technique may involve that described in Jager. See, e.g., Jager, P., Steinmann, P., Kuhl, E., 2008, *Modeling three-dimensional crack propagation—A comparison of crack path tracking strategies*, Int. J. Numer. Methods Eng. 76, p. 1328 to 1352. To achieve the objective, the following equations (eq8) and (eq9) are solved using the finite element method in the cell as shown below:

$$\nabla \cdot (K \nabla \phi) = 0 \qquad (eq8)$$

where $$K = I - n \otimes n \qquad (eq9)$$

where n is the normal direction of the extension of the fracture surface in the new cell. Thus, the normal direction n of surface S at the cell edge between nodes. $\phi$ is the level set function to be sought, while I is the identity tensor. The above differential equation (ne9) can be solved with the boundary condition specified at nodes. The finite element procedure may yield level set function values at nodes.

To provide the partition elements for integration operation, mesh elements that are intersected by the fractures need to be partitioned by fractures to perform the integration in equation (ne3). This step is performed after the level set function values are available. Integration may be performed on each of the four polyhedron because the jump and domain functions have different values in each of them.

To perform results gathering operations, fracture characterization involves the information concerning fracture density, orientation, and interconnectivity. Because the geometry of all fractures is explicitly recorded in the partition elements for integration operation, such information are extracted and tabulated from the simulation result.

In addition to output geometries, the fracture geometries may be output and perform a flow simulation on the zone and obtain effective permeability for the simulated zone.

Figure 4:
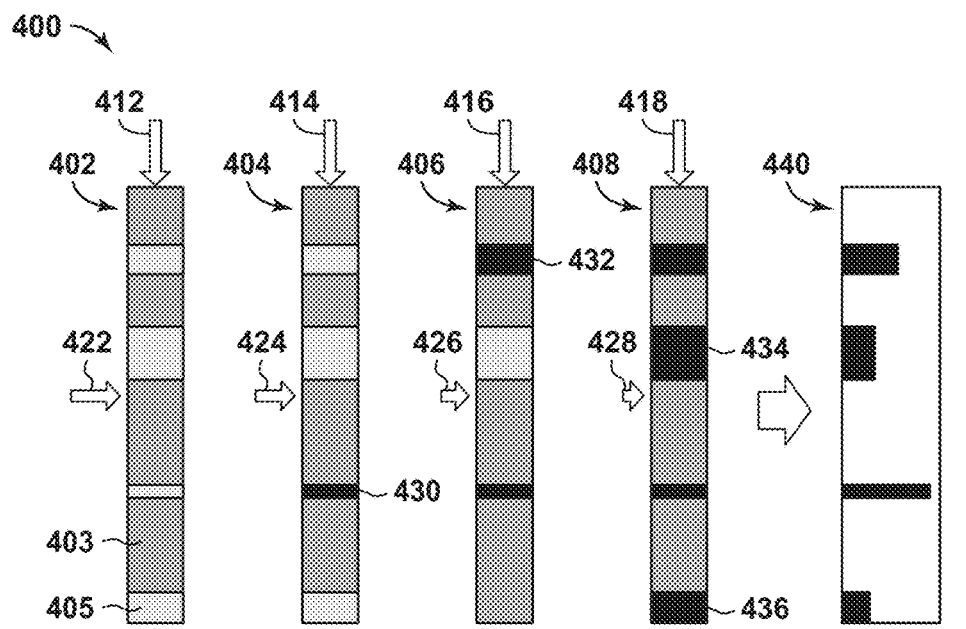
FIG. 4 is an exemplary diagram of a one dimensional (1D) stacking implementation in accordance with the present techniques.
Figure 4:
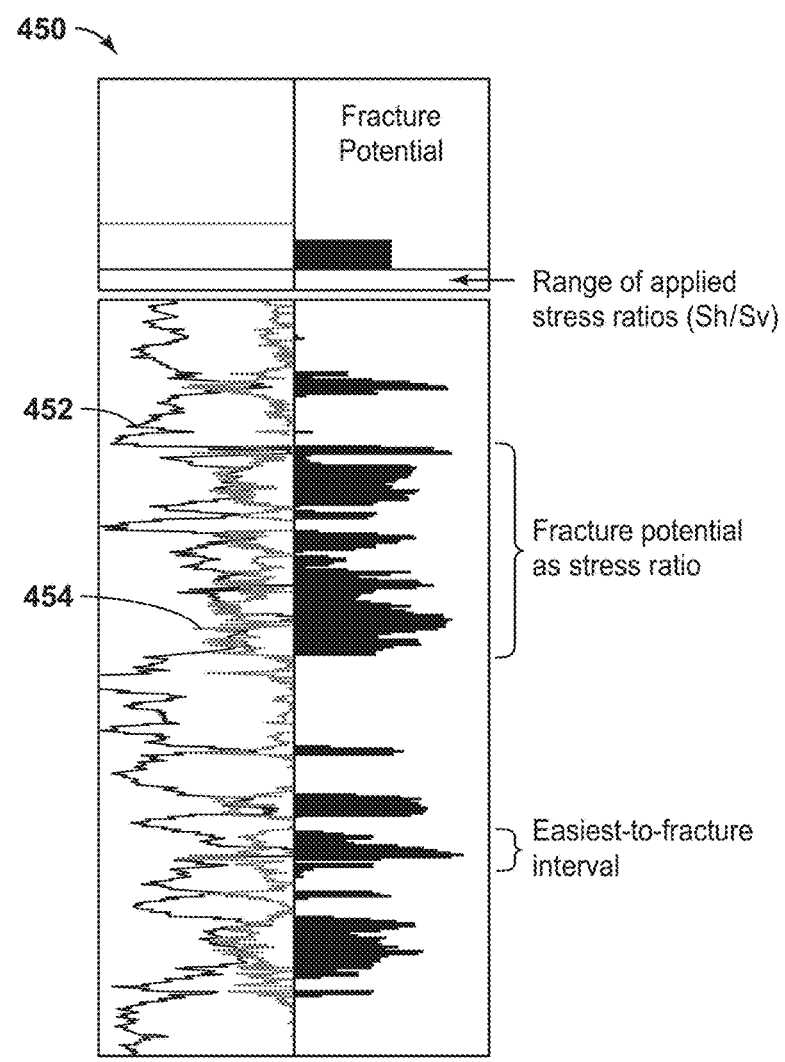

FIG. 4 is an exemplary diagram 400 of a one dimensional (1D) stacking implementation in accordance with an embodiment of the present techniques. In this diagram 400, various 1D responses 402, 404, 406 and 408 for a subsurface region are provided with different layers, such as a weak layer 403 (in brown) and a stiff layer 403 (in tan). The FIG. 4A is an illustration of the fracture potential definition. A mechanical rock column is constructed for any interval of interest in the subsurface. A progressively decreasing Sh/Sv load is applied to the mechanical rock column. The minimum value of Sh/Sv to induce fracturing in each layer is the fracture potential for that point in the mechanical rock column. The fracture potential can be displayed as a continuously varying depth curve to determine locations of natural fractures in the subsurface. Typically continuous curves for the key input variables, Young's modulus an Poisson's Ratio, are displayed adjacent to the derived fracture potential curve.

For each of the various 1D responses 402, 404, 406, and 408, to predict the fractures for various factors are applied to the layers. For example, the respective applied gravity factor, such as applied gravity factors 412, 414, 416, and 418, and the respective applied tectonics and thermal factors, such as applied tectonics and thermal factors 422, 424, 426, and 428, are used to predict fractures in the layers.

The ratio of the applied gravity factor (vertical stress Sv) and applied tectonics and thermal factor (horizontal stress Sh) is the Sh/Sv factor. In this example, the Sh/Sv factor for 1D response 402 is 0.3, for 1D response 404 is 0.2, for 1D response 406 is 0.1 and for 1D response 408 is 0.05. Based on the various factors, certain 1D responses 402, 404, 406, and 408 have failure regions, such as failure region 430 in 1D response 404, failure region 432 in 1D response 406, and failure regions 434 and 436 in 1D response 408.

The resulting fracture potential is shown in the response 440. In this response 440, the different magnitudes of the various failure regions are combined to provide fracture potential for the layers.

For diagram 450, the range of applied stress ratios (Sh/Sv) are shown. In this diagram 450, the response 452 and 454 calculated E and the other is the calculated PR. The response 452 may be calculated from the Young's Modulus (E) curves, while the response 454 is calculated from Poisson's ratio (PR) curves. The Young's Modulus (E) and Poisson's ratio (PR) calculations are shown equations (E3) and (E4):

$$E = 2\rho V_s^2 (1 + PR) \qquad (E3);$$

where Vs is shear wave velocity, $\rho$ is density and PR is Poisson's ratio, which is shown in equation (E4); and $$PR = \frac{0.5 * \left(\frac{V_p}{V_s}\right)^2 - 1}{\left(\frac{V_p}{V_s}\right)^2 - 1}; \qquad (E4)$$

where Vp is compressional wave velocity and Vs is shear wave velocity.

Then, a stress calculation is applied to a well log, for each sample depth the stress ratio required to drive tensile failure is recorded fracture potential and the output is visualized as the Fracture Potential.

Figure 5:
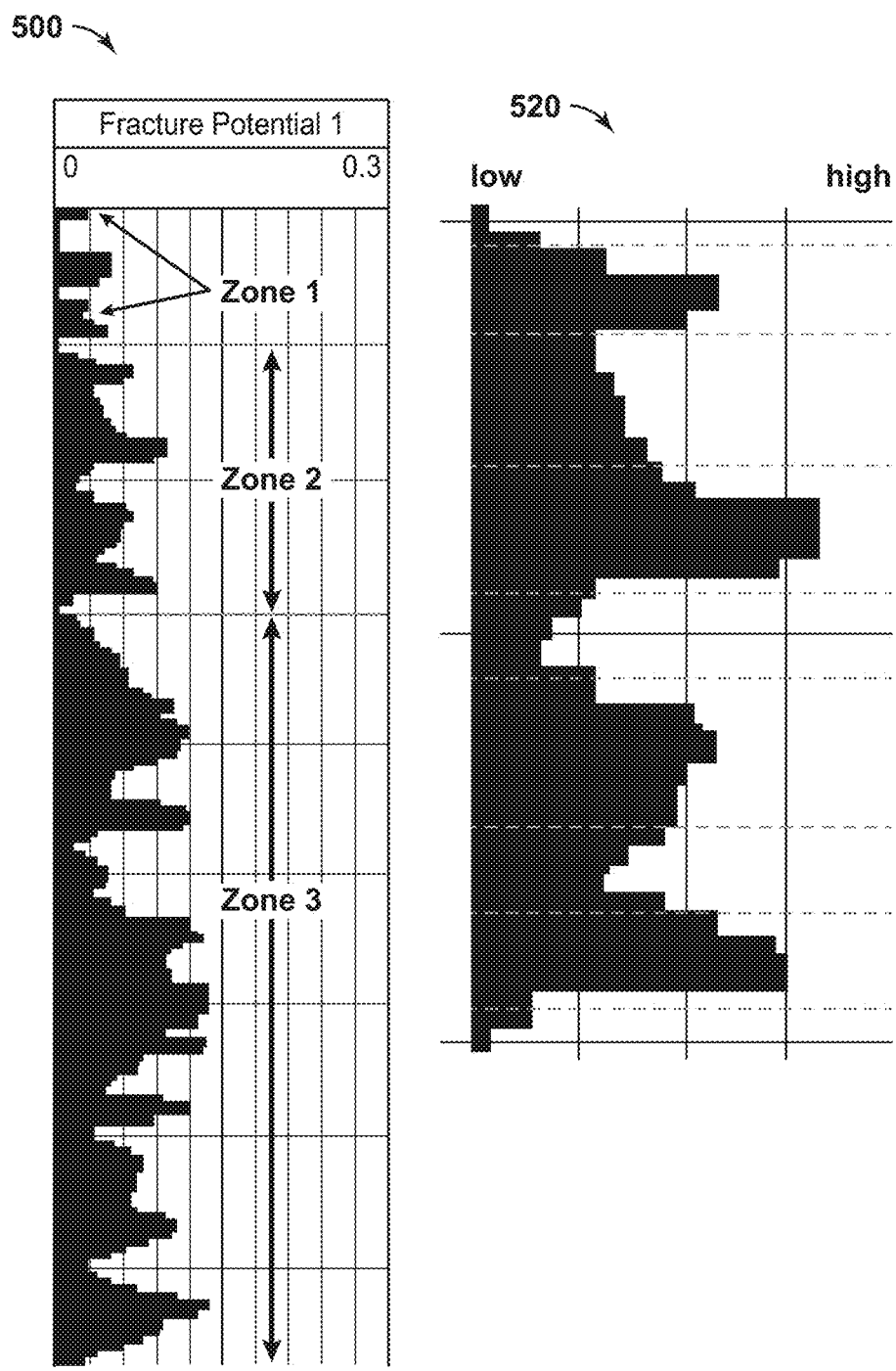
FIG. 5 is an exemplary diagram of a representation of a subsurface region in accordance with the present techniques.

FIG. 5 is an exemplary diagram 500 of a representation of a subsurface region in accordance with an embodiment of the present techniques. In this diagram 500, the fracture stacking potential is shown for zone 1, zone 2 and zone 3.

The fracture potential curve over an interval of interest (e.g., zones 1, 2 and 3) can be used to determine fracture characteristics by calculating metrics based on the curve shape. The curve is typically segmented into zones separated by zero fracture potential. Attributes of each zone or the entire interval of interest can be calculated. For example, the MSP may be calculated for zone 2 as shown in the expanded view 520.

Figure 6:
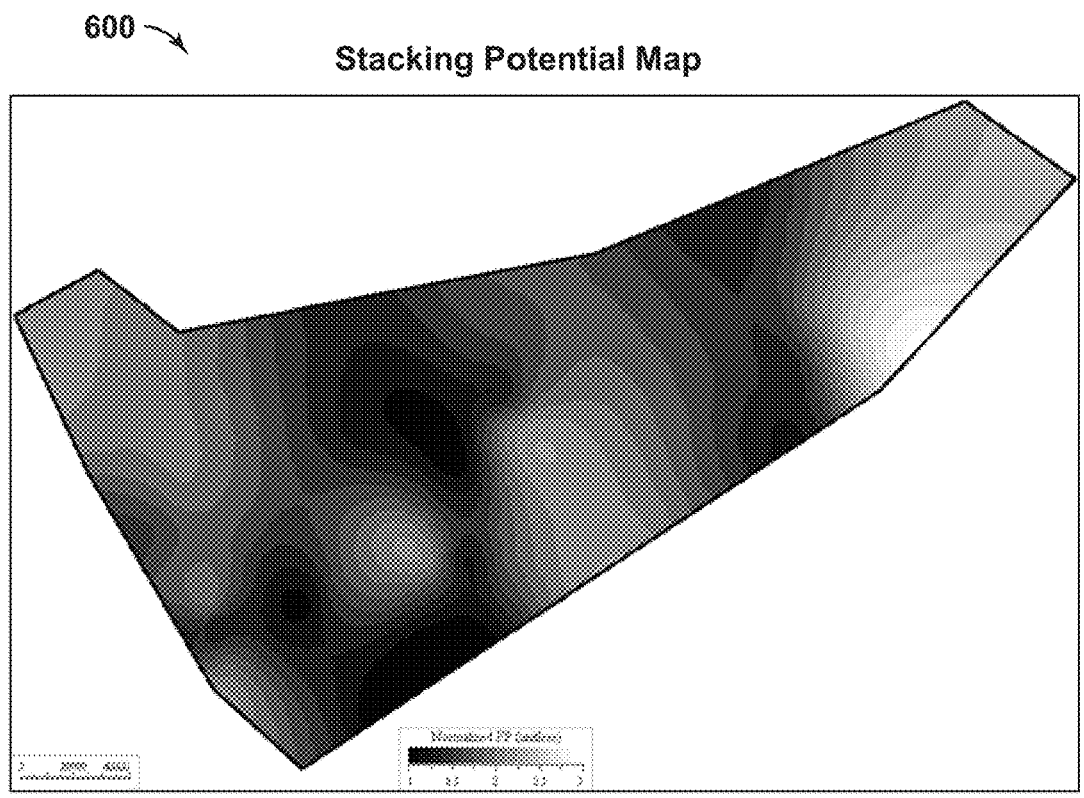
FIG. 6 is an exemplary diagram of a representation of a subsurface region in accordance with the present techniques.

FIG. 6 is an exemplary diagram 600 of a representation of a subsurface region in accordance with an embodiment of the present techniques. In this diagram 600, a 2D representation of natural fracture potential can be calculated utilizing one or more 1D fracture potential metrics from one or more wells. Values for fracture potential or derivative metric are plotted for each 1D well location and interpolated between wells to create a continuous contour map.

Figure 7A:
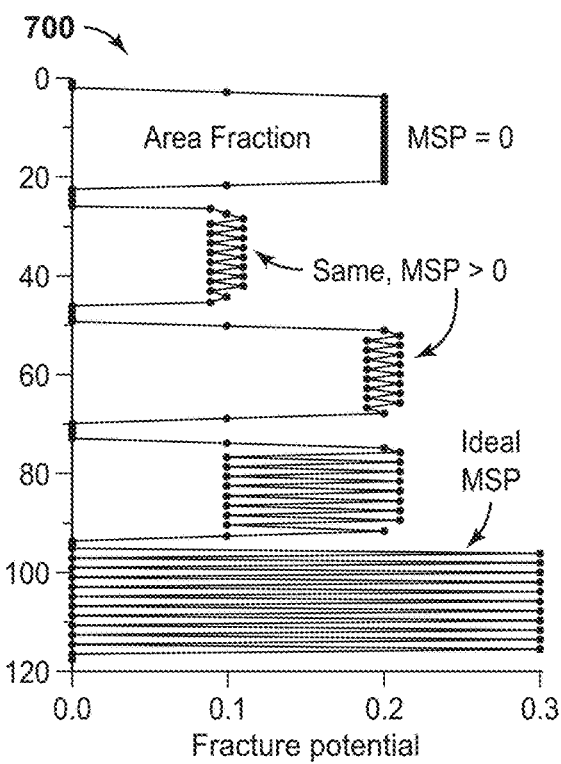
FIGS. 7A, 7B, and 7C are exemplary diagrams of representative fracture stacking potential metrics of a subsurface region in accordance with the present techniques.
Figure 7B:
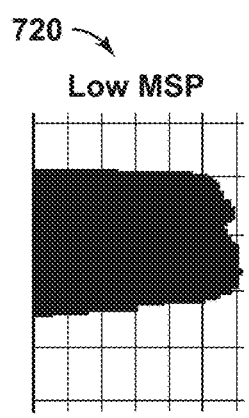
Figure 7C:
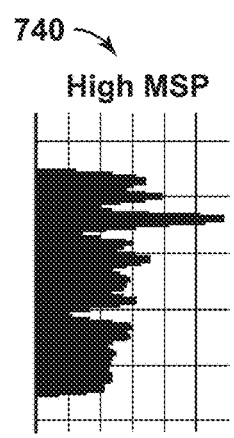
Figure 8A:
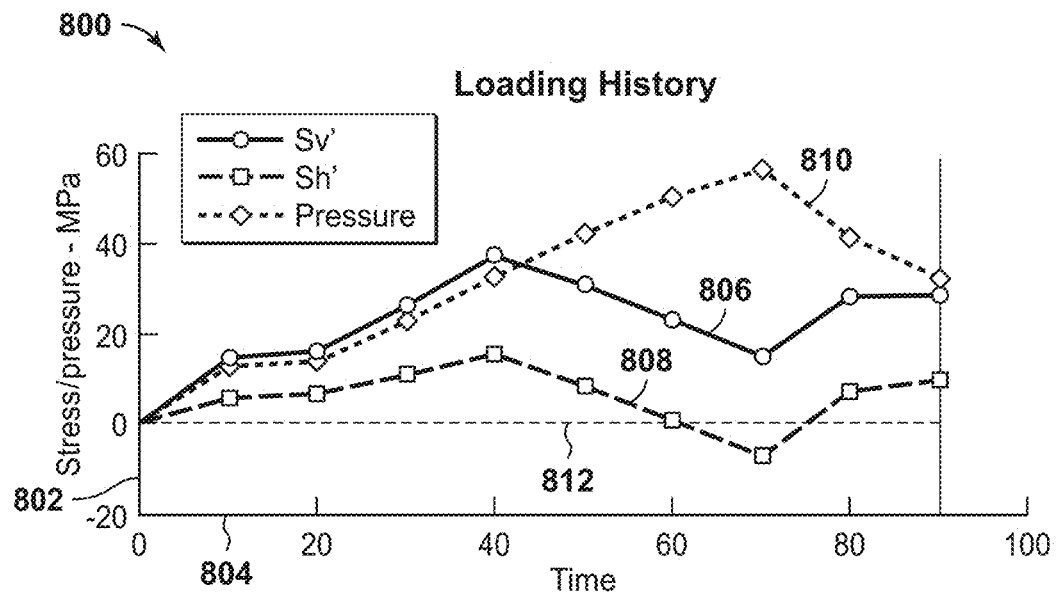
FIGS. 8A, 8B, 8C, and 8D are exemplary diagrams of numerical results in accordance with the present techniques.
Figures 8B, 8C, 8D:
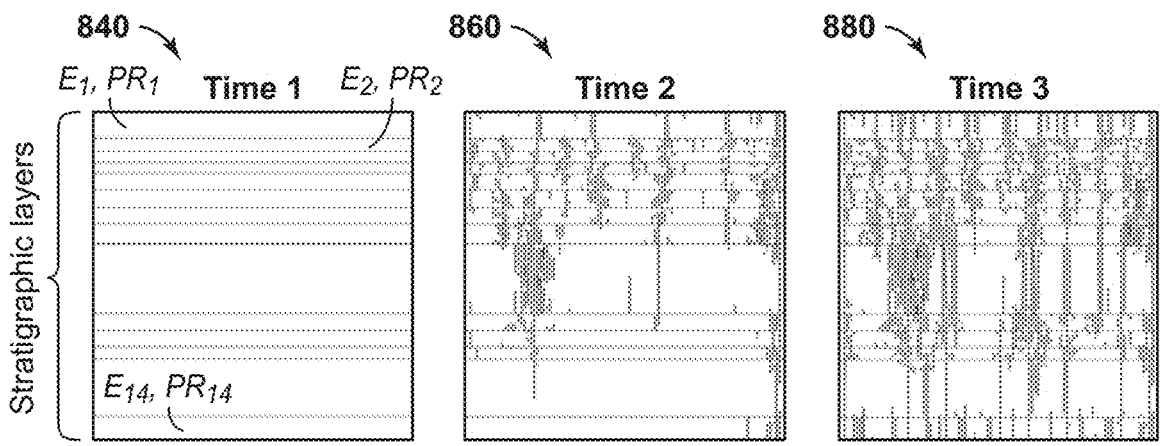

FIGS. 7A, 7B, and 7C are exemplary diagrams 700, 720, and 740 of representative fracture stacking potential metrics of a subsurface region in accordance with an embodiment of the present techniques. In diagram 700, MSP metric is based on the variability of a continuous fracture potential curve within each zone over an interval of interest. MSP sums the frequency and amplitude of FP variability and is independent of the absolute value or total area fracture of the FP curve. MSP is normalized based on an ideal typical response. The MSP metric thus differentiates between zones of similar FP area fraction but different degrees of heterogeneity. In diagram 720, the low MSP zones may have relatively widely spaced fractures occurring within a single continuous mechanical layer. In diagram 740, high MSP zones represent multi scale fracture networks with a range of fracture spacing and heights with enhanced connectivity.

FIGS. 8A, 8B, 8C, and 8D are exemplary diagram 800, 840, 860, and 880 of numerical results in accordance with an embodiment of the present techniques. In these diagrams 800, 840, 860, and 880, an explicit fracture numerical model can be applied in conjunction with the FP analysis. Diagram 800 is an example of a loading history based on analysis of the burial, exhumation and pore pressure history of a sedimentary basin for various responses 806, 808, 810, and 812 for stress/pressure axis 802 in mega Pascals verses time along the time axis 804. In diagram 840, a 2D cross section model is created over an interval of interest identified using the 1D fracture potential and other metrics. Mechanical layering is created from a well log analysis of mechanical rock properties. In diagram 860, the time varying loading history is applied as model boundary conditions and a numerical model creates fractures as a function of the mechanical interaction of the layers responding to the loading. Further, in diagram 880, the result is an explicit representation of a fracture network in the subsurface.

Figure 9:
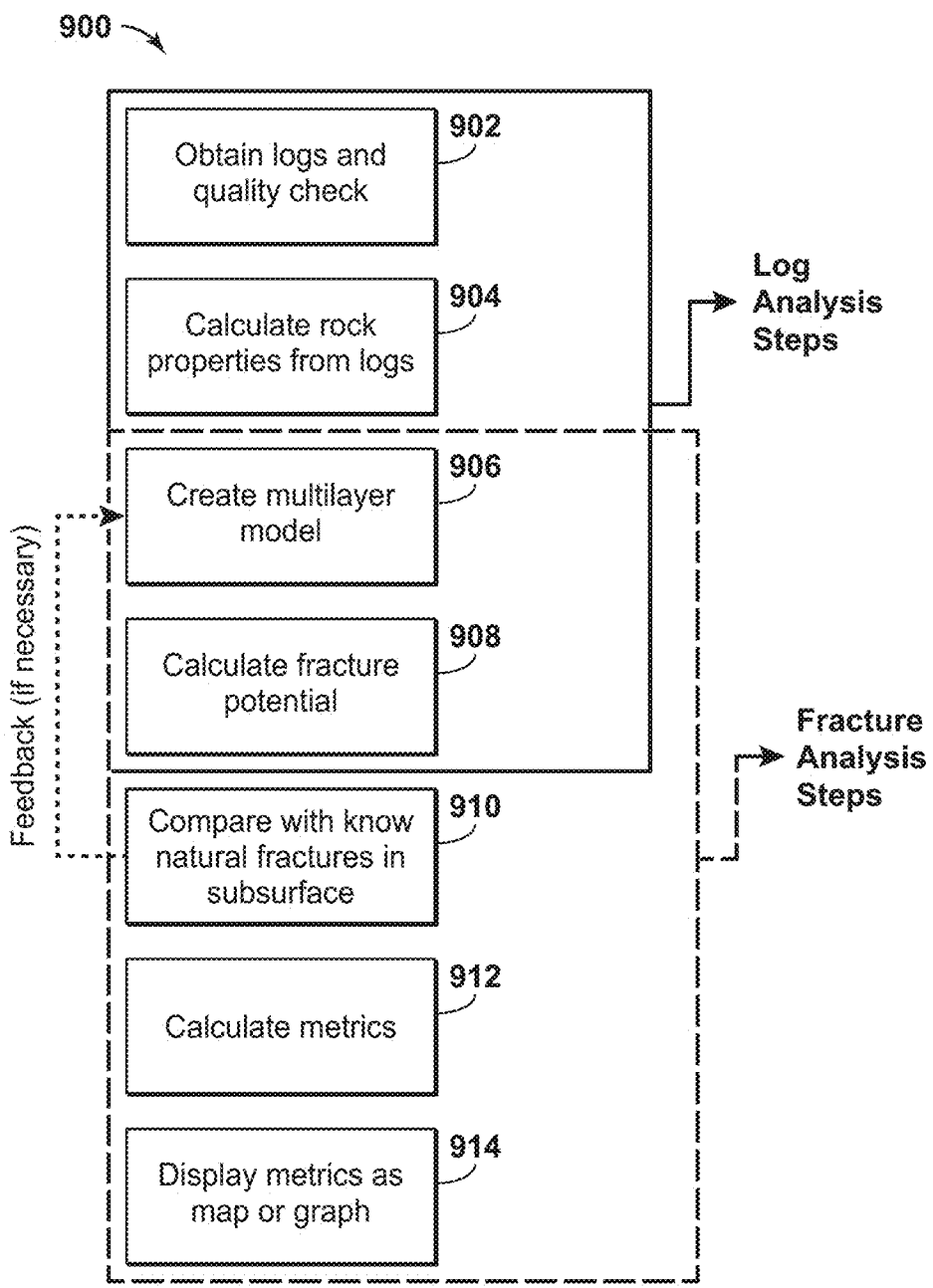
FIG. 9 is an exemplary diagram of logic blocks in a method to calculate and display metrics associated with natural fractures in accordance with the present techniques.

FIG. 9 is an exemplary diagram 900 of logic blocks in a method to calculate and display metrics associated with natural fractures in accordance with an embodiment of the present techniques. The technology is applied in a petroleum industry example workflow. The input model is derived from well log analysis, can be either a 1D, 2D or 3D mechanical stratigraphy. Fracture analysis is performed on the final input model and the metrics applied to the fracture potential calculation. Results displayed as well logs, cross-sections, maps or volumes depending on input data.

In this diagram 900, the log analysis steps are in blocks 902 to 908, while the fracture analysis steps are in blocks 906 to 914. In this diagram 900, the logs and quality check are performed in block 902. Then, at block 904, the rock properties are calculated from the logs. At block 906, the multi-layer model is created. The multi-layer model includes the rock properties. At block 908, the fracture potential is calculated. The calculation may include generating the fracture potential for two or more loads for the multi-layer model. Then, at block 910 the calculated fracture potential is compared with known natural fractures in the subsurface. This step may update the multilayer model if it is deemed necessary. At block 912, metrics are calculated from the fracture potential. At block 914, the metrics are displayed as a map and/or graph.

Figure 10:
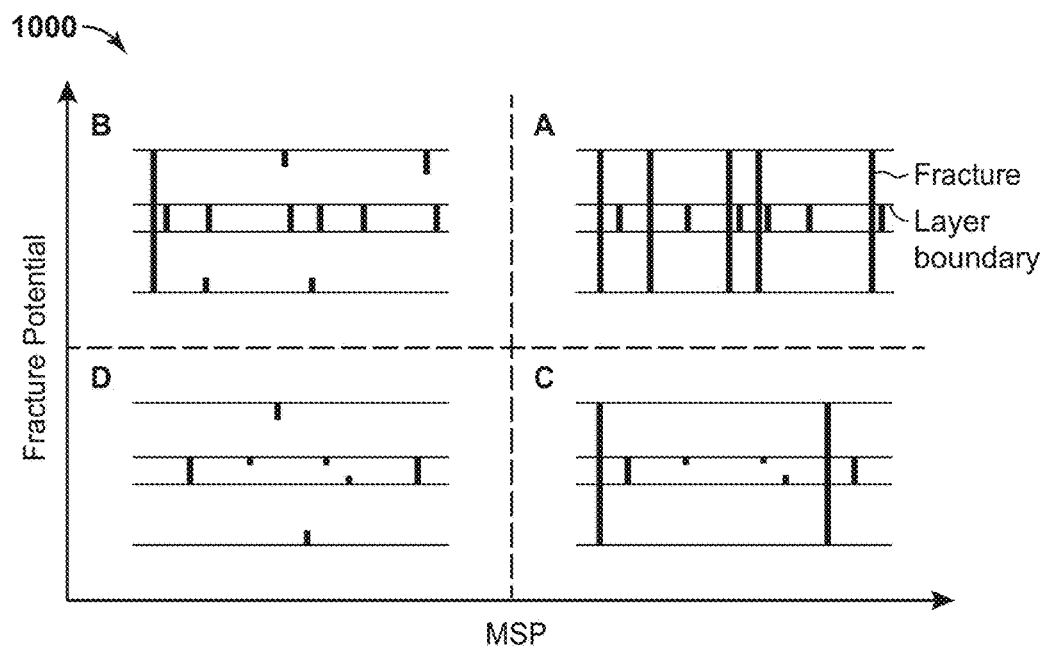
FIG. 10 is an exemplary diagram of discrete fracture distributions attributed to each quadrant of the MSP verses FP diagram in accordance with the present techniques.

FIG. 10 is an exemplary diagram 1000 of discrete fracture distributions attributed to each quadrant of the MSP verses FP diagram in accordance with an embodiment of the present techniques. In diagram 1000, the metrics are combined to predict different fracture characteristics. For example, where fracture potential is high and MSP metric is high, the fracture network is well developed with a wide range of fracture spacing and heights resulting in high fracture connectivity (e.g., region A). Conversely where fracture potential and MSP are low the fracture network is sparsely developed without multi-scale fractures resulting in low fracture connectivity (e.g., region D).

Figure 11:
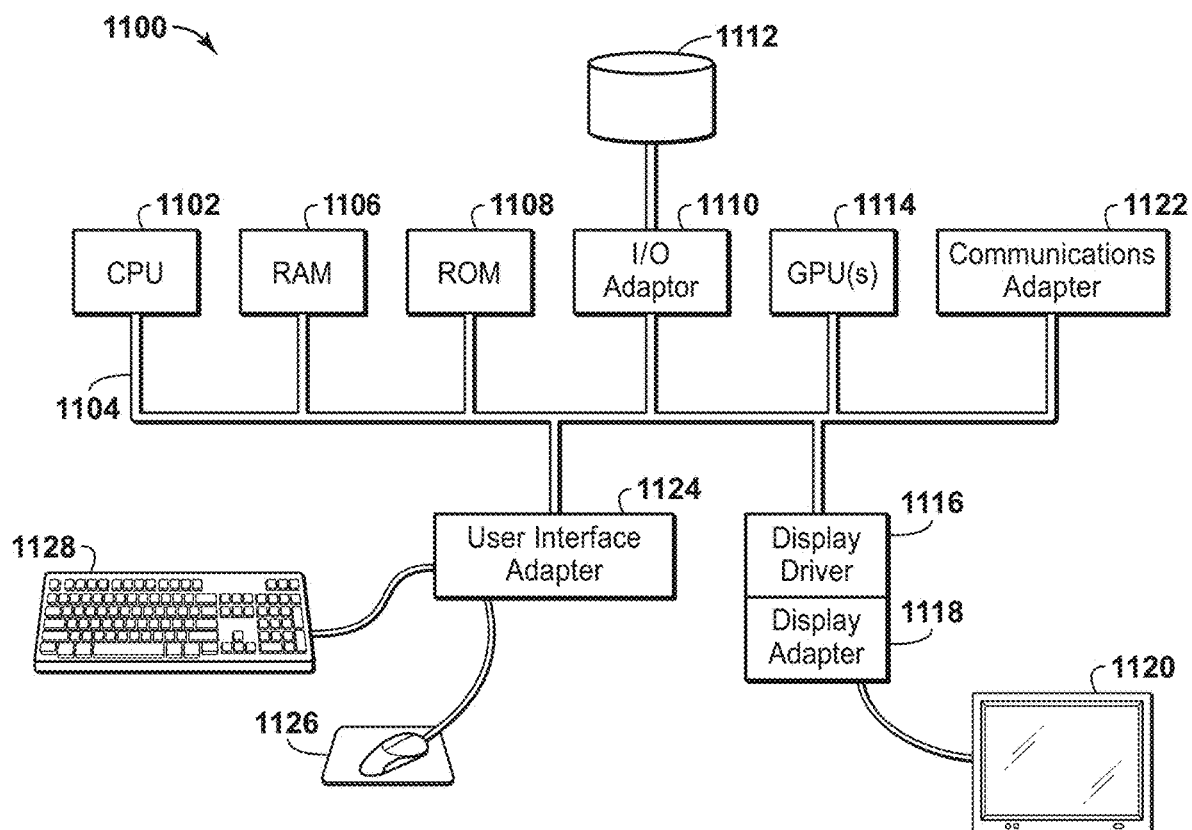
FIG. 11 is a block diagram illustrating a computer environment for use in accordance with the present techniques.

FIG. 11 illustrates a computer system 1100 on which software for performing processing operations relating to aspects of the disclosed methodologies and techniques may be implemented. A central processing unit (CPU) 1102 is coupled to the system. CPU 1102 may be any general purpose CPU or application-specific CPU. The disclosed aspects are not restricted by the architecture of CPU 1102 or other components of computer system 1100. The CPU may execute the various logical instructions for performing processing according to the exemplary operational flow described in conjunction with methods disclosed herein. For example, CPU 1102 may execute machine-level instructions, or machine-readable code, for performing operational blocks 102 to 116 of FIG. 1; blocks 202 to 216 of FIG. 2; blocks 302 to 322 for FIG. 3; and/or blocks 902 to 914 of FIG. 9.

Computer system 1100 may include one or more machine-readable media such as random access memory (RAM) 1106 and read only memory (ROM) 1108. RAM 1106 holds user and system data and programs, such as a computer program product containing code effectuating methods of the aspects, methodologies and techniques disclosed herein. The computer system also includes an input-output (I/O) adapter 1110 coupled to memory 1112, a graphical processing unit (GPU) 1114, communication adapter 1122, and display driver 1116 and a display adapter 1118 coupled to a display device 1120. Computer system 1100 may also include a user interface adapter 1124 to receive inputs from a keyboard 1128 or a mouse 1126. The display driver 1116 and a display adapter 1118 may be used to visually provide results of one or more portions of the method described in FIGS. 1 to 3 and FIG. 9 via the display device 1120.

The disclosed aspects, methodologies and techniques may be susceptible to various modifications, and alternative forms and have been shown only by way of example. The disclosed aspects, methodologies and techniques are not intended to be limited to the specifics of what is disclosed herein, but include all alternatives, modifications, and equivalents falling within the spirit and scope of the appended claims.

What is claimed is:

1. A method of predicting natural fractures in a subsurface region, the method comprising:
creating a multi-layer model of the subsurface region;
populating the multi-layer model with mechanical rock properties;
iteratively for two or more time steps:
(a) applying a plurality of loads to the multi-layer model at each time step, wherein applying the plurality of loads at each time step comprises changing loads over the previous time step to reflect interpretation of actual geologic loads based on a burial and deformation history;
(b) determining a stress in each layer of the multi-layer model at each time step for each of the plurality of loads;
(c) determining a tensile failure at each layer in the multi-layer model at each time step for each of the plurality of loads to create one or more natural fractures in the multi-layer model; and
(d) updating the mechanical rock properties in the multi-layer model, wherein the mechanical rock properties are updated to reflect changes in mechanical compaction and chemical induced changes to the rocks at each time step;
determining one or more fracture characteristics associated with the one or more natural fractures for each layer in the multi-layer model based on the tensile failures; and
performing hydrocarbon management for the subsurface region based on the one or more fracture characteristics.

2. The method of claim 1, further comprising determining one or more numerical results associated with natural fractures for each layer in the multi-layer model based on the tensile failures.

3. The method of claim 2, further comprising creating a representation of the subsurface region with one or more tensile failures, one or more fracture characteristics, numerical results, and any combination thereof.

4. The method of claim 2, further comprising creating a representation of the subsurface region based on the one or more fracture characteristics and the numerical results.

5. The method of claim 1, wherein the one or more fracture characteristics comprise one of fracture stacking potential; normalized fracture stacking potential; multi-scale fracture stacking potential; total fracture stacking potential, and any combination thereof.

6. The method of claim 1, wherein the method further comprises obtaining measurements from one or more of wireline logs and core data for the subsurface region and using the obtained measurements to create the multi-layer model of the subsurface region, and wherein determining the one or more fracture characteristics comprises calculating a multi-scale fracture stacking potential by solving:

$$MSP = \sum_{n=1}^{\# of samples} \frac{\text{Independent Peak Amplitude}}{\left(\text{Reference } FP * \left(\frac{\text{Zone Length}}{2} - 1\right)\right)}$$

where n is an integer for the number of samples where the number of samples is the number of measurements; Independent Peak Amplitude is the highest value for a continuous non-zero section of the fracture potential response for a zone of interest; Reference FP is highest value for the multi-scale fracture stacking potential over all of the samples; and Zone Length is length of the zone of interest.

7. The method of claim 1, wherein the method further comprising obtaining measurements from one or more of wireline logs and core data for the subsurface region; and using the obtained measurements to create the multi-layer model of the subsurface region, and wherein determining the one or more fracture characteristics comprises calculating a total fracture stacking potential by solving:

$$TSP = \sum_{n=1}^{\# Zones} \left(MSP_n + \frac{FP_n}{C * (L_{zone_n})}\right) * \frac{L_{zone_n}}{L_{interval}},$$

where n is number of zones; $MSP_n$ is the multi-scale fracture stacking potential for the $n^{th}$ zone; $FP_n$ is the fracture stacking potential for the $n^{th}$ zone; C is a normalization factor; $L_{zonen}$ is length of the $n^{th}$ zone; and $L_{interval}$ is total length of the zones in the interval of interest in the wireline logs or core data.

8. The method of claim 1, further comprising obtaining measurements from one or more of wireline logs and core data for the subsurface region; and using the obtained measurements to create the multi-layer model of the subsurface region.

9. The method of claim 1, wherein the multi-layer model is a one-dimensional model comprising a plurality of layers oriented along an axis.

10. The method of claim 1, wherein the mechanical rock properties are elastic mechanical rock properties.

11. The method of claim 1, wherein the plurality of time steps relate to evolution of a basin.

12. The method of claim 1, wherein the mechanical rock properties at one or more of a plurality of time steps is based on one or more of depth of burial, temperature changes, pore pressure changes, elastic properties of rock over time.

13. The method of claim 1, wherein the creating the multi-layer model comprises:
(i) defining a zone for numerical modeling;
(ii) separating the multi-layer model into one or more stratigraphic layers;
(iii) constructing a mesh for the zone, wherein the mesh partitions the zone into various mesh elements; and
(iv) assigning material constitutive models for each of the one or more stratigraphic layers.

14. The method of claim 13, wherein determining a stress in each layer of the multi-layer model comprises stimulating the multi-layer model based on macromechanical geological loads in one or more loading steps, wherein each loading step comprises:
(i) solving one or more conservation of linear momentum equations associated with the zone;
(ii) determining if the solution for the conservation of linear momentum equations for any of the mesh elements in the multi-layer model exceed a fracture initiation or propagation criterion;
(iii) if the solution for all of the mesh elements does not exceed the fracture initiation or propagation criterion, continue to step (v);

(iv) if the solution for any of the mesh elements exceeds the fracture initiation or propagation criterion, the method further comprises:
   a. selecting the mesh element associated with the solution that exceeds the fracture initiation or propagation criterion by the largest absolute value as the mesh element to fracture;
   b. determining fracture surface direction in the mesh element to be fractured based on fracture growth direction criteria;
   c. calculating one or more level set values based on the fracture surface direction;
   d. determining sub regions for the mesh element based on the one or more level set values; and
   e. repeating to step (i) using the determined sub regions to represent the mesh element; and
(v) storing the fracture characterization results for the loading step.

15. The method of claim 14, wherein solving of conservation of linear momentum equation comprises solving the expression:

$$\nabla \cdot \sigma + \rho g = 0$$

where g is gravity, $\rho$ is rock density, and $\sigma$ is total stress.

16. The method of claim 14 wherein the conservation of linear momentum equation includes an enrichment term to capture discontinuities associated with displacements in the zone.

17. The method of claim 14, wherein solving of conservation of linear momentum equation comprises solving the expression:

$$u^h(x) = \sum_{i=1}^{N^e} N_i(x) u_i + \sum_{k=1}^{Nf} \sum_{i=1}^{N^e} N_i(x) a_i^k (H_k(x) - H_k(x_i)) D_k(x)$$

where $u^h$ is interpolation of displacement, k is the fracture, $H_k$ is the jump function for the fracture k, $D_k$ is a domain function for the fracture k, $N^e$ is number of nodes in the mesh element, i is the node, x is the location, $x_i$ is location of $i^{th}$ node, $u_i$ is displacement of the node i, $N^f$ is number of fractures, $a_i$ is enrichment unknown of the node i, and $N_i$ is the shape function of the node i.

18. A fracture prediction system comprising:
a processor;
an input device in communication with the processor and configured to receive input data associated with a subsurface region;
memory in communication with the processor, the memory having a set of instructions, wherein the set of instructions, when executed, are configured to:
   create a multi-layer model of the subsurface region;
   populate the multi-layer model with mechanical rock properties;
   iteratively for two or more time steps:
      (a) apply a plurality of loads to the multi-layer model at each time step, wherein applying the plurality of loads at each time step comprises changing loads over the previous time step to reflect interpretation of actual geologic loads based on a burial and deformation history;
      (b) determine a stress in each layer of the multi-layer model at each time step for each of the plurality of loads;
      (c) determine a tensile failure at each layer in the multi-layer model at each time step for each of the plurality of loads to create one or more natural fractures in the multi-layer model; and
      (d) updating the mechanical rock properties in the multi-layer model, wherein the mechanical rock properties at one or more of a plurality of time steps are updated to reflect changes in mechanical compaction and chemical induced changes to the rocks over time;
   determine one or more metrics associated with natural fractures for each layer in the multi-layer model based on the tensile failures; and
   display the one or more metrics.

19. A method of modelling natural fractures in a subsurface region, the method comprising:
creating a multi-layer model of the subsurface region;
populating the multi-layer model with mechanical rock properties;
iteratively for one or more time steps:
   (a) applying a plurality of loads to the multi-layer model at each time step, wherein applying the plurality of loads at each time step comprises changing loads over the previous time step to reflect interpretation of actual geologic loads based on a burial and deformation history;
   (b) determining a stress in each layer of the multi-layer model at each time step for each of the plurality of loads;
   (c) determining a tensile failure at each layer in the multi-layer model at each time step for each of the plurality of loads;
   (d) creating one or more natural fractures in the multi-layer model; and
   (e) determining if an additional time step is needed and if an additional time step is needed updating the mechanical rock properties in the multi-layer model for the additional time step, wherein the mechanical rock properties are updated to reflect changes in mechanical compaction and chemical induced changes to the rocks at each time step;
displaying a representation of the subsurface region comprising the natural fractures.

* * * * *